US008329002B1

(12) United States Patent
Githinji et al.

(10) Patent No.: US 8,329,002 B1
(45) Date of Patent: Dec. 11, 2012

(54) THIN FILMS AND METHODS AND MACHINES FOR FORMING THE THIN FILMS

(75) Inventors: Anthony Githinji, Centreville, VA (US); Sami C. Antrazi, Fairfax, VA (US); David A. Baldwin, Annandale, VA (US)

(73) Assignee: 4Wave, Inc., Sterling, VA (US)

( * ) Notice: Subject to any disclaimer, the term of this patent is extended or adjusted under 35 U.S.C. 154(b) by 707 days.

(21) Appl. No.: 12/382,192

(22) Filed: Mar. 10, 2009

(51) Int. Cl.
*C23C 14/00* (2006.01)
(52) U.S. Cl. ............... 204/192.21; 204/192.22; 438/104
(58) Field of Classification Search .................. 438/104, 438/785–786; 204/192.21, 192.22
See application file for complete search history.

(56) References Cited

U.S. PATENT DOCUMENTS

| | | | |
|---|---|---|---|
| 5,450,053 A | | 9/1995 | Wood |
| 6,026,763 A | * | 2/2000 | Kim et al. .............. 118/723 HC |
| 6,127,914 A | | 10/2000 | Sasaki |
| 6,313,463 B1 | | 11/2001 | Cole et al. |
| 6,322,670 B2 | | 11/2001 | Cole et al. |
| 6,413,385 B1 | | 7/2002 | Sasaki |
| 7,473,030 B2 | | 1/2009 | Bruce et al. |
| 7,473,031 B2 | | 1/2009 | Wolkin et al. |
| 2006/0057304 A1 | * | 3/2006 | Zhang et al. .................. 427/569 |
| 2008/0280206 A1 | * | 11/2008 | Oukassi .................... 429/231.5 |

OTHER PUBLICATIONS

Sakuma et al., "Gas Flow Sputtering: Versatile Process for the growth of Nanopillars, nanoparticles, and epitaxial thin films", Journal of Magnetism and Magnetic Materials, vol. 321, Issue 7, pp. 872-875.*
D. Severin, et al *"Process stabilization and increase of the deposition rate in reactive sputtering of metal oxides and oxynitrides"*; 2006 American Institute of Physics, Applied Physics Letters 88, pp. 161504-1 thru 161504-3 (2006).

* cited by examiner

*Primary Examiner* — Richard A. Booth
(74) *Attorney, Agent, or Firm* — Morgan, Lewis & Bockius LLP

(57) ABSTRACT

Methods for depositing an amorphous vanadium oxide ($VO_x$) film include vaporizing vanadium from a vanadium source while the a gas containing an oxygen species and a process modifying additive are in the chamber so as to deposit an amorphous $VO_x$ film on the substrate, where $x>0$. The process modifying additive includes a gas flowing into the chamber or vaporized material from a target source. The additive may stabilize the deposition rate of $VO_x$, reduce resistivity, improve thickness control, and improve uniformity of thickness and resistivity. The thin film may be a nitrogen-enhanced, amorphous vanadium oxide ($VO_xN_y$) film formed on a substrate, where $x>y>0$, and the film contains at least 0.2 atomic % nitrogen. The film may be used in a device, such as a thermal or infrared sensor, or more particularly a bolometer.

66 Claims, 12 Drawing Sheets

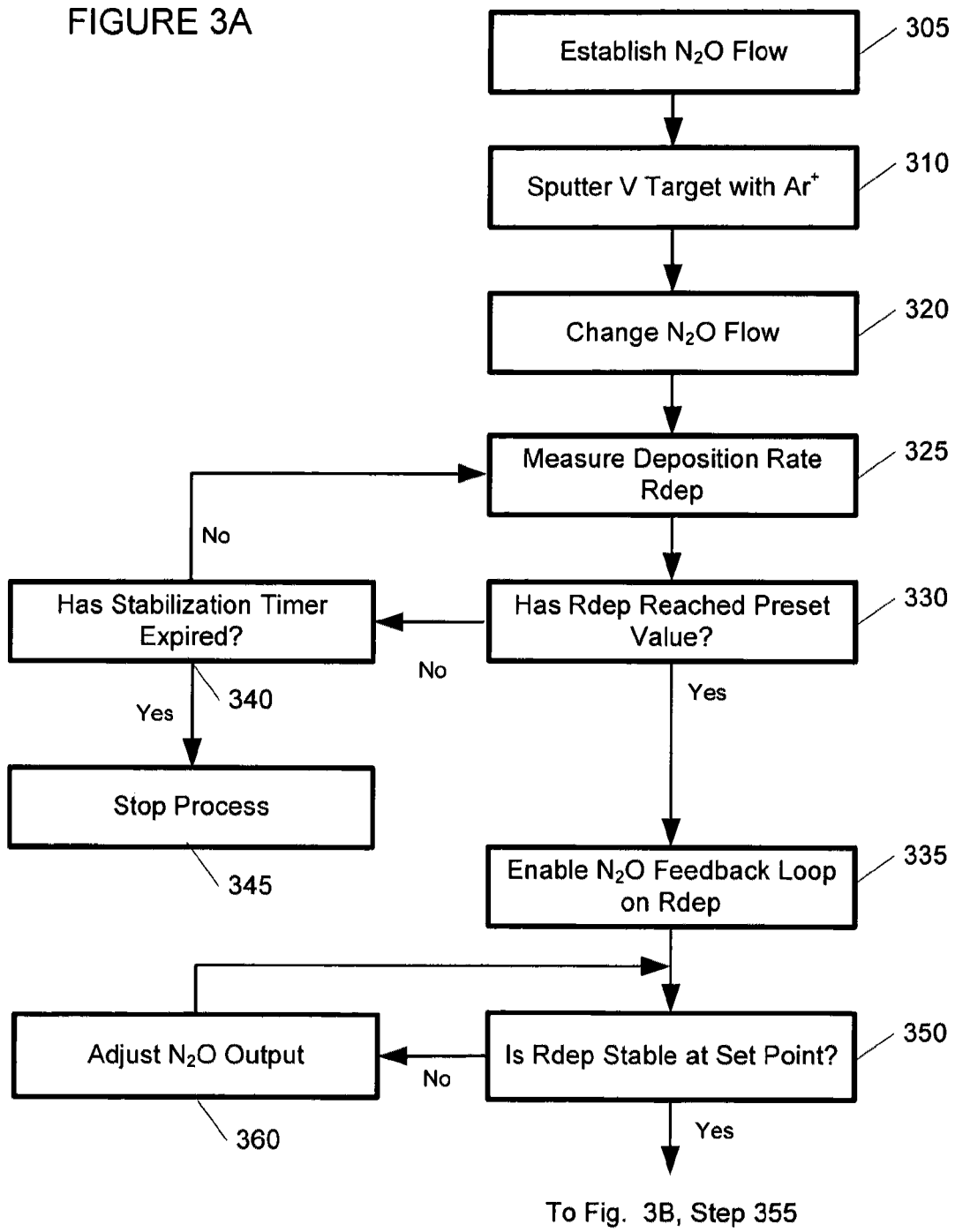

Run 10F - Run Parameters vs Time, Full Run

Run 10F - Run Parameters vs Time, Later Parts

Run 09J - Process Parameters vs Time, Full Run

Run 09J - Process Parameters vs Time, Later Parts

Run 15G - Process Parameters vs Time, Full Run

Run 15G - Process Parameters vs Time, Later Parts

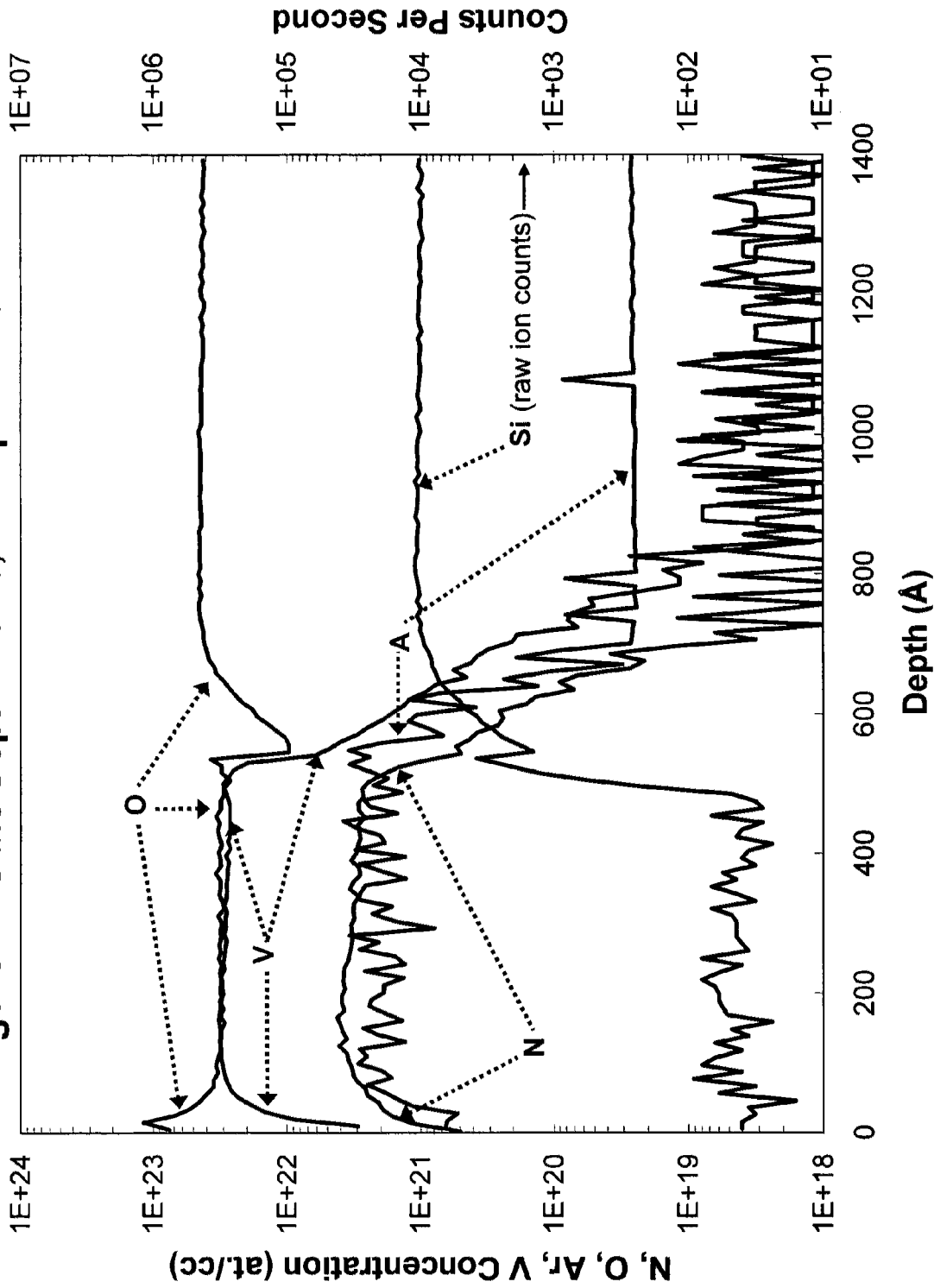
Figure 7 - SIMS Depth Profile, Example Case "15G"

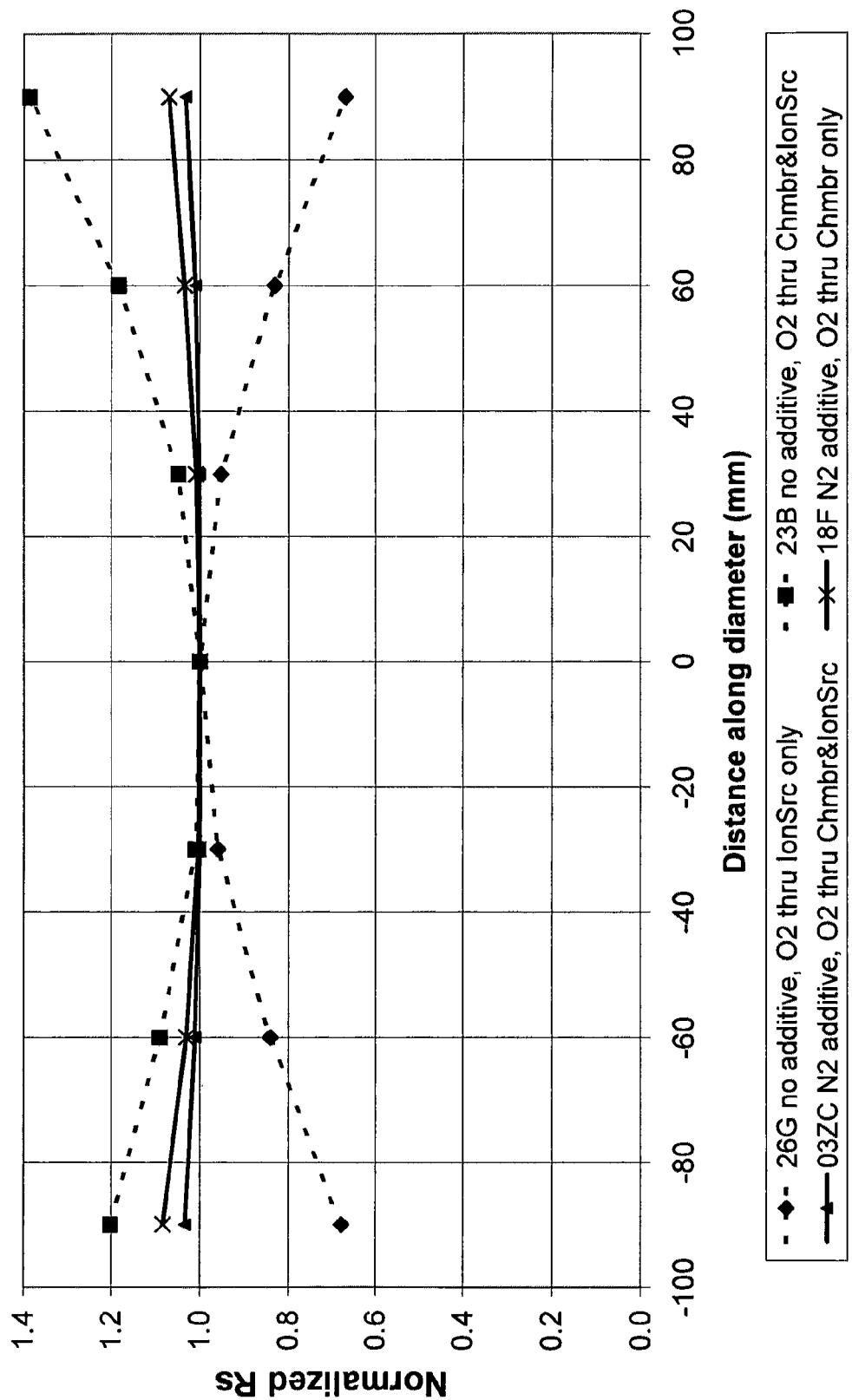

THIN FILMS AND METHODS AND MACHINES FOR FORMING THE THIN FILMS

FIELD OF THE INVENTION

The present invention relates to thin films of compounds containing certain metallic and non-metallic elements, methods for forming the thin films, and machines for performing the methods. More particularly, and by way of example, the invention relates to thin films of vanadium oxide, methods for forming the vanadium oxide thin films, and machines for performing the methods.

BACKGROUND OF THE INVENTION

Vanadium oxide ($VO_x$) films are useful because the electrical resistance of the film is very sensitive to temperature over a useful range of temperatures. This means that relatively small changes in temperature cause easily detected changes in the electrical resistance of the $VO_x$ film. In other words, $VO_x$ has a high temperature coefficient of resistivity or TCR. This property of $VO_x$ films can be used advantageously to build many different kinds of sensors. For example, $VO_x$ thin films are used to build microbolometers, the sensors in thermal cameras.

However, $VO_x$ films having such desirable properties are difficult to manufacture. Single crystal $VO_2$ material undergoes a phase change from semiconductor (insulator) to metal with a decrease in electrical resistivity of several orders of magnitude as temperature is increased through 67-68° C. as observed by F. J. Morin, Phys. Rev. Lett. 3, 34 (1959). This temperature is too high for many applications and the change in electrical resistivity is too sharp. For example, $VO_x$ films used for thermal cameras require TCR characteristics with a much smaller change in resistivity spread out over a wider temperature range to include room temperature (~20° C.). U.S. Pat. No. 6,127,914 a mixed crystal $VN_xO_y$, where $0<x<1$ and $2 \leq y \leq 13/6$, as a material with a high TCR and a low specific resistance. However, this material has not been widely adopted, particularly in sensors, such as bolometers. The manufacture of this mixed crystal material has several drawbacks. For example, the reported deposition rate is low, making it undesirable for commercial manufacture. In addition, the mixed crystal $VN_xO_y$ is deposited on a heated substrate to 300° C. Heating the substrate to such temperatures is incompatible with manufacturing processes commonly used to manufacture bolometers.

One problem faced in manufacturing $VO_x$ films is that both V and O are extremely chemically reactive and, as a result, their reaction is difficult to control. A frequent symptom of loss of control is extreme instability of process parameters related to the O-reactant supply, which results in growth of $VO_x$ with unwanted or inconsistent film properties. The chemical reactions that produce the $VO_x$ film often sensitively affect the film's properties, such as the structure and composition of the film, the film thickness, the uniformity of thickness, the sheet resistance (resistivity×thickness), and the uniformity of resistivity measured laterally over the film. For example, both the $VO_x$ layer deposition rate and its resistivity appear to be sensitive to unintended variations in the deposition process, even when the values of all adjustable process parameters remain the same or are nominally constant. As a practical matter, this sensitivity to unintended variations is so great that, from run to run using conventional processes, layer thickness and resistivity for amorphous $VO_x$ films may both deviate from the desired values by ±10%, and deviations of ±20% or even ±50% are not uncommon, all for what were intended to be identical runs. In addition, the layer thickness and resistivity of the $VO_x$ film are not uniform across the substrate. U.S. Pat. No. 6,127,914 does not address the problems associated with film uniformity and reproducibility.

The disadvantages of conventional $VO_x$ layer deposition significantly increase labor and material costs. Such costs include extended process qualification time, extended chamber conditioning time, more frequent chamber maintenance and reduced product yields. Accordingly, there remains a need for new materials useful in sensors and other applications, and new manufacturing processes and machines for manufacturing thin layers of the materials.

SUMMARY OF THE INVENTION

The present invention overcomes one or more of the problems with conventional processes and yields an improved $VO_x$ thin film. In accordance with one aspect, a chemical species added to the conventional vapor deposition process for $VO_x$ film growth improves the stability of the process parameters and enables practical manufacturing of desirable $VO_x$ compositions with reduced oxygen content and correspondingly lowered electrical resistivity. In accordance with another aspect, a chemical species added to the conventional vapor deposition process for $VO_x$ film growth results in beneficially improved uniformity of resistivity of the grown $VO_x$ film laterally across a device substrate wafer. In accordance with other aspects, the $VO_x$ film is an amorphous material and may be manufactured without heating the substrate on which the film is deposited. In accordance with yet another aspect, a chemical species added to the conventional vapor deposition process for $VO_x$ film growth results in at least some atoms from the added chemical species becoming incorporated into the $VO_x$ thin film, resulting in beneficially lowered electrical resistivity. Since the added chemical species of the present invention beneficially modifies at least one aspect of the fabrication of $VO_x$ materials, or the material itself, the added chemical species may be referred to as a process modifying additive, with the understanding that the deposition process may be beneficially modified regarding the stability of the deposition parameters, the uniformity of the properties (e.g., resistivity) of the deposited film, and/or the composition of the deposited film. In operation of the invention, the process modifying additive is introduced into the deposition process directly as a gas or as a vapor generated from gaseous, liquid or solid sources by action of a variety of secondary processes including but not limited to heating, sputtering, plasma activation and/or chemical decomposition. The process modifying additive may be introduced into the process in various chemical forms at one or more of a multiplicity of points of entry, and the loci of effect of the process modifying additive upon the process may be multiple, e.g., the surface of the substrate, the surface of the growing film, the surface of a material source (e.g., a sputter target), the interior walls of the process chamber and other locations, as will be made clear, regardless of its point of entry.

An aspect of the invention involves a method for manufacturing an amorphous vanadium oxide ($VO_x$) film including loading a substrate into a deposition chamber, flowing a first gas into the chamber, the first gas containing a reactive oxygen species, flowing nitrogen gas into the chamber, and vaporizing vanadium from a vanadium source while the first gas and the nitrogen gas are flowing into the chamber so as to deposit an amorphous $VO_x$ film on the substrate, where x>0.

A further aspect involves method for manufacturing a vanadium oxide ($VO_x$) film including loading a substrate into a deposition chamber, flowing a gas into the chamber, wherein the molecular content of the gas includes at least nitrogen and oxygen, vaporizing vanadium from a vanadium target while the gas is flowing into the chamber so as to deposit a $VO_x$ film on the substrate, where x>0.

Also disclosed is a method for manufacturing a vanadium oxide ($VO_x$) film including loading a substrate into a deposition chamber, flowing a first gas into the chamber, the first gas containing a reactive oxygen species, and vaporizing vanadium and nitrogen from a vanadium nitride target while the first gas is flowing into the chamber so as to deposit a $VO_x$ film on the substrate, where x>0.

Also disclosed is a method for depositing an amorphous vanadium oxide ($VO_x$) film, including loading a substrate into a deposition chamber, flowing a first gas into the chamber at a first regulated flow rate, the first gas containing a reactive oxygen species, flowing a process modifying additive gas into the chamber at a second regulated flow rate, wherein the first flow rate is greater than the second flow rate, and vaporizing vanadium from a vanadium source while the first gas and the process modifying additive gas are flowing into the chamber so as to deposit an amorphous $VO_x$ film on the substrate, where x>0.

In addition, a method for depositing an amorphous vanadium oxide ($VO_x$) film is disclosed. The method includes loading a substrate into a deposition chamber, flowing a first gas into the chamber, the first gas containing a reactive oxygen species, flowing process controlling gas into the chamber, and vaporizing vanadium from a vanadium source while the first gas and the process controlling gas are flowing into the chamber so as to deposit an amorphous $VO_x$ film on the substrate, where x>0, wherein the process controlling gas stabilizes the deposition rate of $VO_x$.

Also disclosed is a method for depositing an amorphous vanadium oxide ($VO_x$) film including loading a substrate into a deposition chamber, flowing a first gas into the chamber, the first gas containing a reactive oxygen species, flowing a process stabilization gas into the chamber, and vaporizing vanadium from a vanadium source while the first gas and the nitrogen gas are flowing into the chamber so as to deposit an amorphous $VO_x$ film on the substrate, where x>0, wherein the process stabilization gas stabilizes the deposition rate of $VO_x$.

A method for manufacturing an amorphous vanadium oxide ($VO_x$) film is disclosed that includes loading a substrate into a deposition chamber, flowing a first gas into the chamber, the first gas containing a reactive oxygen species, and vaporizing vanadium from a vanadium source while the first gas is flowing into the chamber so as to deposit an amorphous $VO_x$ film on the substrate, where x>0 and wherein the $VO_x$ film has a resistivity of at most 0.3 ohm-centimeters and a non-uniformity of resistivity of less than 1.0% over a region having a diameter of at least a 130 mm.

A method for manufacturing an amorphous vanadium oxide ($VO_x$) film includes loading a substrate into a deposition chamber, flowing a first gas into the chamber, the first gas containing a reactive oxygen species, supplying a second gas and a third gas to an ion source, wherein the second gas comprises an inert gas and the third gas comprises a reactive oxygen species, activating the ion source, and vaporizing vanadium from a vanadium source using the ion source while the first gas is flowing into the chamber and the second gas and the third gas are supplied to the ion source so as to deposit a $VO_x$ film on the substrate, where x>0 and wherein the $VO_x$ film has a resistivity of at most 0.3 ohm-centimeters and a non-uniformity of resistivity of less than 3.0% over a region having a diameter of at least a 130 mm.

A further aspect of the invention involves a thin film including a nitrogen-enhanced, amorphous vanadium oxide ($VO_xN_y$) film formed on a substrate, where x>y>0, and the film contains at least 0.2 atomic % nitrogen.

A further thin film includes a carbon-enhanced vanadium oxide film $VO_xC_y$ film formed on a substrate, where x>y>0, and the film contains at least 0.2 atomic % carbon.

Also disclosed is a device including a substrate, a nitrogen-enhanced, amorphous vanadium oxide ($VO_xN_y$) film formed on the substrate, where x>y>0, and the film contains at least 0.2 atomic % nitrogen, and at least first and second electrodes electrically connected to the vanadium oxide film.

A thermal sensor is also disclosed that includes a nitrogen-enhanced, amorphous vanadium oxide ($VO_xN_y$) film, where x>y>0, and the film contains at least 0.2 atomic % nitrogen, wiring electrically connected to the vanadium oxide film, and a readout integrated circuit coupled to the wiring.

In addition, an infrared sensor is disclosed. The infrared sensor includes an infrared absorber, and a readout circuit. The thermal sensor comprises a nitrogen-enhanced, amorphous vanadium oxide ($VO_xN_y$) film, where x>y>0, and the film contains at least 0.2 atomic % nitrogen.

It is to be understood that both the foregoing general description and the following detailed description are exemplary and explanatory and are intended to provide further explanation of the inventions as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 3A and 3B provide a second example of a process for depositing a thin film in accordance with the present invention.

FIG. 7 provides a chemical analysis depth profile by SIMS of the material deposited by the process example of the present invention represented in FIGS. 6A and 6B.

FIG. 8 provides four plots of sheet resistance $R_s$ of $VO_x$ at measurement sites across the diameter of 200 mm wafers FIG. 9 provides a schematic of a thermal sensor including a bolometer.

DETAILED DESCRIPTION

Figure 1:
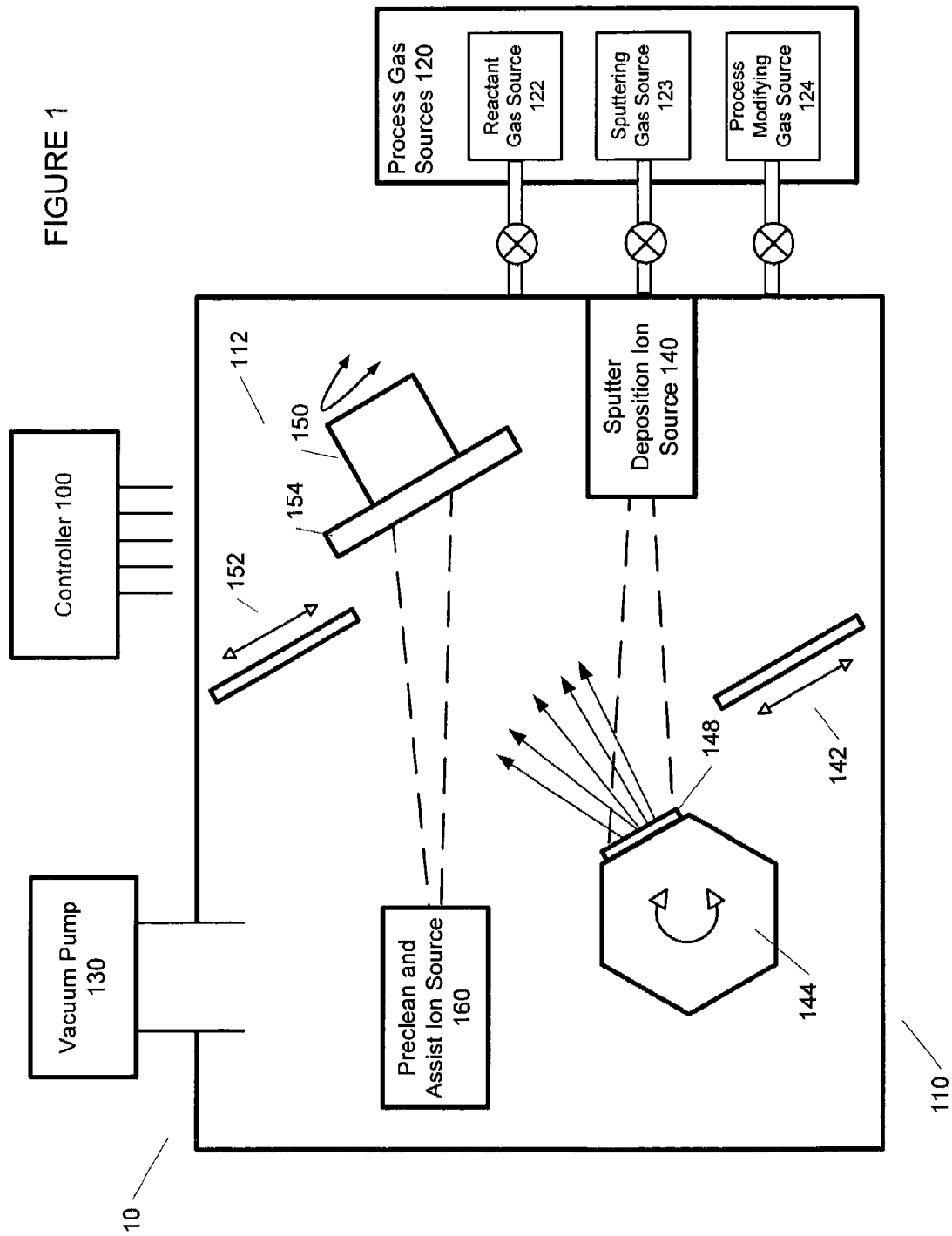
FIG. 1 illustrates an example of a physical vapor deposition machine 10 that may be used to form a thin film consistent with the present invention.

While described in detail below in connection with $VO_x$, aspects of the invention more generally include forming thin film metal hydrides, carbides, nitrides, and oxides by chemically reactive combination/surface-condensation of a metal vapor and a gas or vapor species containing the non-metal element to which the metal ultimately bonds. The invention may also be used by the same scheme to form, without limitation, thin film borides, fluorides, sulfides, and phosphides. More generally, the invention may be used in forming by the same scheme thin film metal:non-metal compounds in which there is one or more metallic element and one or more non-metallic elements present. With respect to the thin films of any such compounds or compound solids, the metal:non-metal composition ratio may be less stable relative to other composition ratios (e.g., $VO_2$ or $V_2O_5$) under classical valence theory. In this regard, the metal:non-metal composition ratio may be continuously variable over a much larger range than explainable by common defects and non-idealities of otherwise known compounds. Such materials with less stable compositional ratios can have useful properties, such as a sensitivity of resistance to temperature over a relatively wide range of temperatures around room temperature, a desirable property for some sensors. Such materials may be described as compositionally non-stoichiometric.

Aspects of the present invention relate to the growth or manufacture of thin-film vanadium oxide ($VO_x$) layers, such as approximately 10-150 nm thick, for example, 40-100 nm thick, for use in various electronic, optical, thermal, mechanical, magnetic and chemical-sensor and/or chemical-catalytic devices or applications. However, it should be understood that the film thickness is exemplary and not intended to be limiting and that the film thickness may be set as desired for the application. In thin film form, $VO_x$ is preferably amorphous, but may be crystalline, polycrystalline, or nanocrystalline for some applications. In accordance with the principles discussed herein, vanadium oxide ($VO_x$) compositions may have oxygen (O) to vanadium (V) atomic percent ratios O:V less than the value 2:1=2 characteristic of the thermodynamically-stable, highly oxidized compound $VO_2$. Such compositions are designated $VO_x$, with $1.0 \leq x < 2.0$ being commonly observed, though compositions with $x<1$ and $x \geq 2.0$ are known and are included in the term $VO_x$. In crystalline form, $VO_x$ may assume many phases with various specific values of x. For example, $VO_x$ may have various x values, such as 2.5, 2.0, 1.5, and 1.0, corresponding to compositionally stoichiometric $V_2O_5$, $VO_2$, $V_2O_3$, and VO, respectively. In amorphous form, $VO_x$ may exhibit x values that are continuously variable over a wide range of x, including x values between 0 and 1.0, between 1.0 and 1.5, between 1.5 and 2.0, between 2.0 and 2.5, and greater than 2.5, which correspond to compositionally non-stoichiometric $VO_x$. As will be discussed below, the composition ratio of O:V that provides the desired film properties in a amorphous $VO_x$ film may vary due to, or be adjusted to compensate for, the incorporation of one or more constituent elements in addition to O and V. Notwithstanding, it should be clear that principles discussed herein may be applied to any morphology and composition, including crystalline morphologies.

Also encompassed by the term $VO_x$ are compositions including minority amounts of other metallic and/or non-metallic elements, e.g., tungsten (W) or iron (Fe) in place of vanadium and carbon (C) or nitrogen (N) in place of O, but including other elements from the periodic table. For example, as used herein, $VO_x$ compositions may include hydrogen (H), even though $VO_x$ is not normally analyzed for hydrogen content. Stated another way, the term $VO_x$ is used herein to include other compositions that include substantial amounts of V and O, such as $VO_xN_y$.

Methods are disclosed for forming thin-film $VO_x$ layers by vapor deposition upon a substrate in a substantially vacuum environment. For example, vanadium atomic vapor (including possibly some diatomic, triatomic, etc. species) may be produced from a vanadium metal source and reactively combined with an oxygen source (e.g., $O_2$ gas) to form $VO_x$ on the surface of a substrate or the surface of previously existing $VO_x$ material. The vanadium vapor may be produced from a vanadium metal source by physical vapor deposition (PVD), e.g., evaporation, plasma ion sputtering, ion beam sputtering, arc vaporization, or laser ablation. The methods disclosed herein permit the film composition, deposition rate, gaseous partial pressures and vanadium vapor production rate to be controlled when depositing $VO_x$ by PVD.

FIG. 1 illustrates an example of a physical vapor deposition (PVD) machine 10 that may be used to form a thin film consistent with the present invention. The illustration has been simplified to promote its understanding. The machine 10 may be used for ion sputtering, such as ion beam sputtering, plasma sputtering, or biased target deposition. The machine includes a controller 100, a vacuum chamber housing 110 including a process chamber 112, process gas sources 120 connected to the chamber housing 110 for supplying process gases to the chamber, and a vacuum pump 130 for evacuating the chamber. The pump 130 may be used to continuously-pump the chamber to maintain low-pressure conditions and to remove atmospheric contaminants. The controller 100 serves to control operation of the machine 10. It may include one or more processors and/or control components such as power supplies, timers, sensor controls, and motion controls. As shown in FIG. 1, the controller 100 includes multiple input/output lines. The input/output lines couple to the various power supplies, timers, sensors, and motion controls. However, for clarity of FIG. 1, the connections of the lines are not shown.

Within the example of PVD machine 10 in FIG. 1, three process gas sources 120 are shown. However, additional process gases may be provided. The process gas sources 120 may include a reactant gas source 122, a sputtering gas source 123 (e.g., argon), and a process modifying additive gas source 124. The gas sources 122-124 can be gas tank assemblies, including mass flow controllers and other flow sensors so that gas flow can be monitored and controlled using the controller 100. For example, the admission of any of the gases to the chamber 112 can be varied using a metering valve to control flow rate, total pressure, partial pressure or deposition rate. Any of the gases may be directed to various points-of-entry into machine 10 by appropriate plumbing and routing of gas lines and appropriately placed ports in chamber housing 110. By default, gases are admitted to the general processing volume of the chamber 112 and distribute themselves substantially uniformly throughout its volume. Gases may also be directed to enter machine 10 via paths associated with various components inside the machine, as noted below for each component, or be directed to nozzles, showerheads and the like inside the machine (not shown) so as to concentrate gas density preferentially in desired geometric locations. The particular reactant gas may be selected depending on the material to be deposited. For example, if an oxide is to be deposited, the reactant gas may be oxygen ($O_2$), water vapor ($H_2O$), or another gas containing a reactive oxygen species, or a combination of such gases. The process modifying additive gas may be nitrogen ($N_2$). However, it could also be methane, ethane, ethylene, carbon tetrafluoride, or carbon dioxide, or other gases, or combinations thereof. The same gas may be used as both a reactant gas and a process modifying additive gas, for example, gases containing both nitrogen and oxygen as molecular components (e.g., $N_2O$, $NO$, $NO_2$, or $NO_3$).

The process modifying additive gas may be a gas added or supplied to the process chamber during the physical vapor deposition of material on the substrate. The flow of process modifying additive gas may be chosen to be constant during deposition or may be varied as desired during deposition. For machine 10 and the examples of the invention described herein, $N_2$ was used as the process modifying additive gas with a flow range of 0.05 to 1.3 sccm, which yielded $N_2$ partial pressures between 0.3 to $8.6 \times 10^{-6}$ Torr. Other values may be used to implement the present invention, however. For example, if the speed of pump 130 were greater, then higher flow values may be used to achieve the same pressures, and, if a faster deposition rate were desired, then a higher pressure range may be employed. The process modifying additive may be chosen from among non-metal species, or molecules and vapors that deliver such species, which are substantially non-reactive or only moderately reactive with the metallic component of the material being deposited, compared with the reactivity of the reactant gas with the metal. While various mechanisms may be utilized, according to one example, the process modifying additive affects the vapor deposition process via less energetic processes including but not limited to physisorption, chemisorption, catalysis or surfactant action. Such processes may occur on surfaces including the substrate surface, the surface of the growing film, the target surface and/or the ancillary surfaces of machine 10, such as the walls and the outer surfaces of other components of the machine within chamber 112.

The chamber housing 110 houses a sputter deposition ion source 140 directed at a target carousel 144 having targets 148. The sputter deposition ion source 140 may be used to generate an ion beam that is directed onto one or more of the targets 148 to sputter material from the targets. The ion source may generate, for example, argon ions ($Ar^+$) substantially derived from the sputtering gas source 123 which, for machine 10 has a point of entry directly into the interior of ion source 140. Optionally, the sputtered flux density is controlled by varying the vaporization power or another parameter of the ion source, for example. By way of example, the beam current, the beam voltage, power, or other parameter may be controlled, and, if the target is biased, the target bias voltage(s), the target current or the target bias frequency, pulse width and %-on-time (duty cycle) may be controlled. As a further option, either a reactant process gas and/or a process modifying additive gas or vapor may be introduced into the process volume 112 in whole or in part using source 140 as the point of entry, and an example relating to this is presented herein. The targets 148 may be made of vanadium metal. However, the targets 148 may be other metals, such as tungsten (W), titanium (Ti), and tantalum (Ta), among others, depending on the material to be deposited. The carousel 144 is rotatable about an axis so that various surfaces of the targets can be exposed to the ion source 140. Other arrangements are also possible. For example, multiple targets can be sputtered simultaneously to deposit an alloy, or one or more alloy targets may be sputtered. In this way, for example, a composition of vanadium with iron or tungsten may be formed.

The chamber 112 also includes a substrate holder 150 that supports one or more substrates 154. While it is not required, the substrate holder 150 may heat, cool and/or rotate the substrate. The substrate(s) may be spun and/or their angle with respect to the vanadium source may be varied by the substrate holder to improve the $VO_x$ layer thickness uniformity and composition uniformity upon the substrate. Note that while heating of the substrate may optionally be used, cooling of the substrate was used for the specific process examples of $VO_x$ deposition presented herein, because amorphous $VO_x$ is preferred for fabrication of microbolometer sensors, and substrate temperatures above some threshold (dependent upon material but thought to be ~100° C. for $VO_x$) may allow the deposited material to assume a crystalline structure. References herein to cooling or otherwise not heating the substrate are not intended to exclude unintentional heating of the substrates that may occur due to radiation from equipment, notably ion source 140, and other ancillary surfaces in chamber 112 which became heated by source 140. The temperature of the substrate was limited during processing to <100° C. and the substrate temperature is maintained laterally uniform across the substrate(s).

A target shutter 142 may be provided between the sputter deposition ion source 140 and the target carousel 144, and a substrate shutter 152 may be provided for shielding the substrate(s) 154 from deposition flux. The chamber 112 may also include a preclean and assist ion source 160. The preclean and assist ion source 160 can be directed at the substrate(s) 154 to preclean the substrate and perform ion-assisted deposition, as desired. The source 160 directed at substrate holder 150 may also be a plasma source, an atom source or an excited neutral atom/molecule source, and may be used as an alternative for delivering the process modifying additive to the substrate(s) or the growing films on the substrate(s), either in ionized, atomic or excited-molecule form or some combination. As such, source 160 may be a flood source, as opposed to a directed-beam source, and thus may also deliver process modifying additive species to the sputter target(s) 148, the walls of the chamber housing 110 or other surfaces in the deposition process environment.

The chamber 112 may also have various sensors for monitoring the deposition process. The sensors may supply inputs to the controller 100. Possible sensors include a deposition flux sensor provided near the substrate to indicate vanadium atom flux and/or $VO_x$ layer thickness growth rate (deposition rate). Such a sensor may be a vibrating quartz crystal microbalance. A total pressure measurement sensor (e.g., an ionization gauge) may also be provided to generate a signal proportional to the gas density of all persistent gaseous species, excepting various ions, radicals and sputtered atoms, from which it is shielded. A gas partial pressure sensor, e.g., a residual gas analyzer (RGA) mass spectrometer, may be provided to individually measure the partial pressure of each persistent gaseous species, again shielded from ions, radicals and sputtered atoms.

While the invention is described above in connection with ion sputtering, as noted, other PVD techniques are possible, such as evaporation or ablation.

Figure 2A:
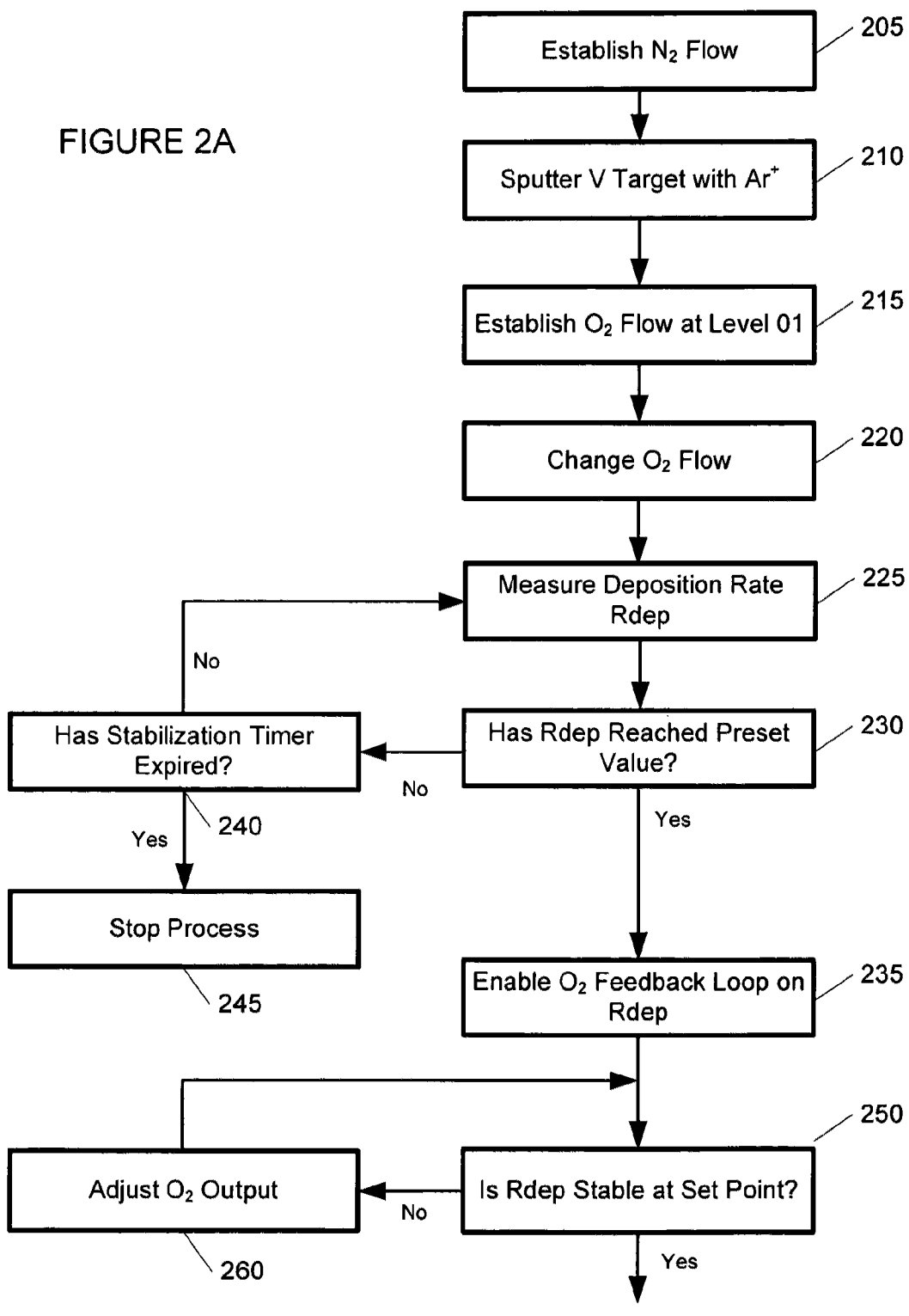
FIGS. 2A and 2B provide an example of a process for depositing a thin film in accordance with the present invention.
Figure 2B:
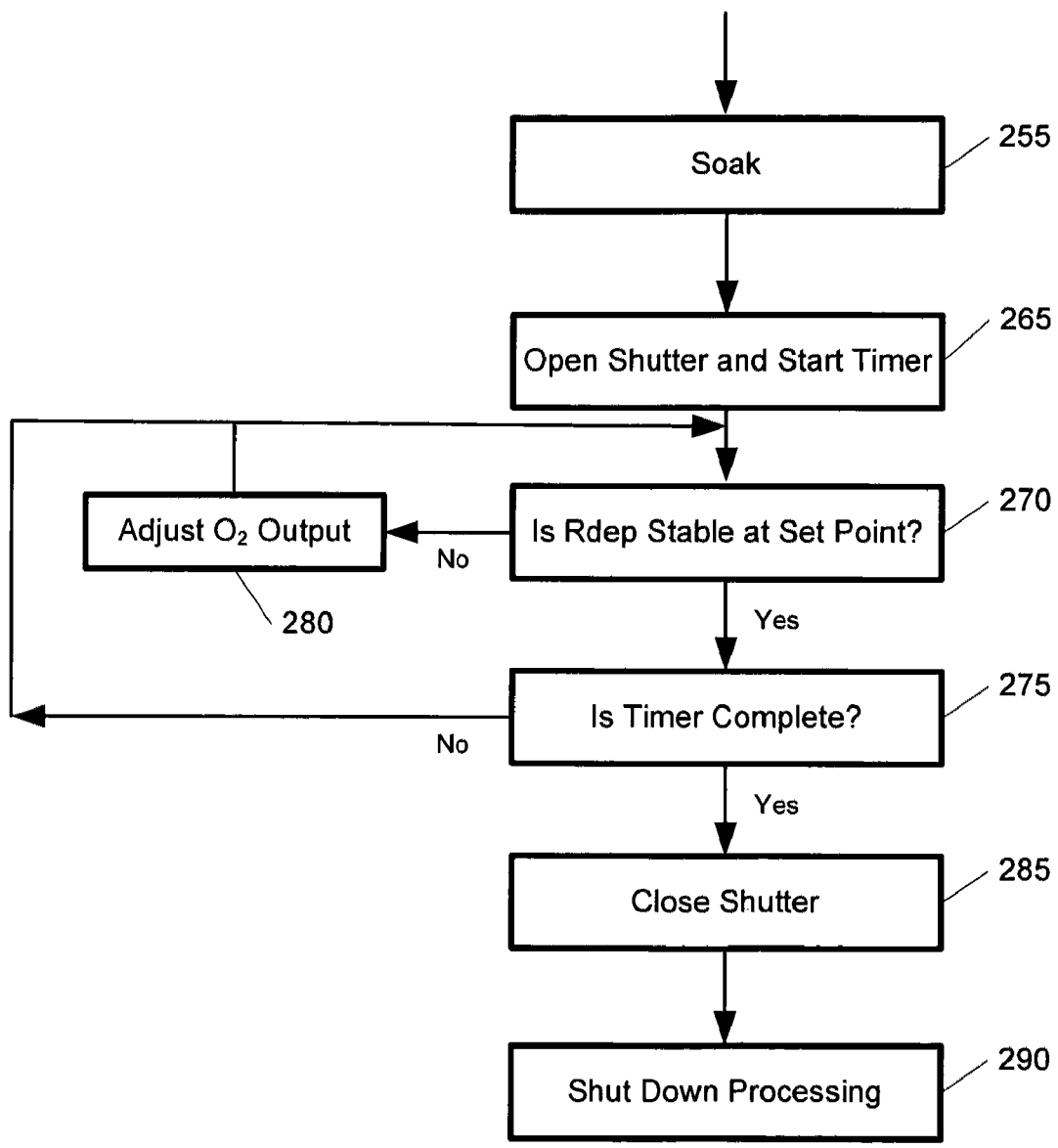

FIGS. 2A and 2B provide an example of a process for depositing a material in accordance with the present invention using the physical vapor deposition machine 10 of FIG. 1. The example of FIGS. 2A and 2B is described in the context of depositing $VO_x$ on a substrate 154 However, other materials may be deposited. The substrate may be a silicon wafer having layers deposited thereon, such as device layers, sacrificial layers, insulating layers, and/or photoresists. Other substrates are possible. For example, the substrate may be glass or a plastic. In the example, the process begins after a substrate is loaded on to the substrate holder 150 in the deposition chamber, a target 148 is loaded on the target carousel 144, and the process chamber 112 is pumped down using vacuum pump 130.

At step 205, a stable flow of a process modifying additive gas, such as nitrogen ($N_2$) at a flow rate of 0.65 sccm in the examples to follow, is established into the process chamber 112. This yields a $N_2$ partial pressure of ~$4.3 \times 10^{-6}$ Torr. At step 210, a vanadium target 148 is sputtered with argon ions ($Ar^+$) initially to clean the surface of the target. The argon ions can be generated by the sputter deposition ion source 140. As the argon sputtering continues, a stable flow of a reactant gas, such as $O_2$, is established into the chamber 112 at step 215. The $O_2$ gas flow may be used to condition the target in advance of the deposition. The $O_2$ flow is then changed to a second level at step 220, such as ~3.2 sccm in the examples to follow. The second level may be a lower level than the first level. However, changing the $O_2$ flow level is not necessary, but may have some advantages in stabilizing the process environment regarding, for example, adsorption of the process gases on the walls of the process chamber 112 as these walls collect stray material sputtered from the target(s). After introduction and stabilization of all gas flows, the process modifying additive gas, the reactant gas and the sputtering gas (with point of entry inside source 140), the total pressure of all gaseous species combined was ~$2 \times 10^{-4}$ Torr, as measured by the aforementioned ion gauge, for the process examples presented herein. However, the total pressure may be, for example, about $5 \times 10^{-5}$ Torr to about $2 \times 10^{-3}$ Torr.

At step 225, the deposition rate of $VO_x$ may be measured. The deposition rate $R_{dep}$ may be measured, for example, using a vibrating quartz crystal microbalance. Of course, $R_{dep}$ may be measured or otherwise determined by other equipment or techniques. Moreover, a measure or characteristic other than $R_{dep}$ may be used. At step 230, the controller 100 determines whether the measured deposition rate $R_{dep}$ has reached a preset value, at least within an error range. If the condition is met, then a feedback control loop is established at step 235 between $O_2$ flow and the measured deposition rate $R_{dep}$. For example, a mass flow controller may be used to control the $O_2$ flow. If the preset value is not reached, then at step 240 controller 100 determines whether a stabilization timer has expired. If not, then the process returns to step 225. If the stabilization timer has expired, the process is stopped at step 245.

After establishing the feedback control loop at step 235, the controller 100 determines whether the deposition rate $R_{dep}$ is stable at step 250. If so, an additional waiting period or "soak" (e.g., 900 seconds) may be permitted at step 255. If the deposition rate $R_{dep}$ is not stable at the desired value, then the $O_2$ flow is adjusted at step 260, e.g., using the mass flow controller, after which the process returns to step 250. The loop is repeated until the deposition rate $R_{dep}$ is stable at the desired setpoint value, at least within an error range.

After the soak step 255, the substrate shutter 152 is opened and a timer is started at step 265. It should be appreciated that the process modifying additive gas, e.g., $N_2$, remains flowing. At step 270, the deposition rate $R_{dep}$ is monitored and evaluated. If the deposition rate is stable, then the controller 100 determines whether the timer has expired at step 275. If the deposition rate is not stable, the $O_2$ flow is adjusted at step 280, e.g., using the mass flow controller, after which the process returns to step 270. If at step 275, the controller 100 determines that the timer has expired, then the shutter 152 is closed at step 285 and the deposition is completed. At step 290, a shut down may be performed, such as turning off ion source power, turning off gas flows, cool down, venting and removal of the substrate. The shut down may vary based on the equipment and/or the process performed. If the timer has not expired, the process reverts to step 270. While the above process describes controlling deposition rate by actively controlling the oxygen flow, deposition rate can be controlled, for example, by actively controlling ion source current, ion source voltage, or other parameters, such as target bias voltage, current, power or duty cycle, or any combination of the foregoing.

It is has been found that flowing a process modifying additive gas, such as nitrogen, into the deposition chamber during deposition of $VO_x$ stabilizes the deposition process of $VO_x$, particularly the deposition rate, from run to run. Also, the layer properties and property uniformity, particularly the electrical resistivity of the $VO_x$ material, the thickness of the $VO_x$ thin film, and thickness uniformity run-to-run can be controlled with greater accuracy, resulting in better $VO_x$ films that can be manufactured at lower cost. Optionally, in addition, atomic elements from the process modifying additive may be incorporated into the deposited film, resulting in beneficial modification of film properties, e.g., reduction in resistivity in the case of $VO_x$.

Figure 3B:
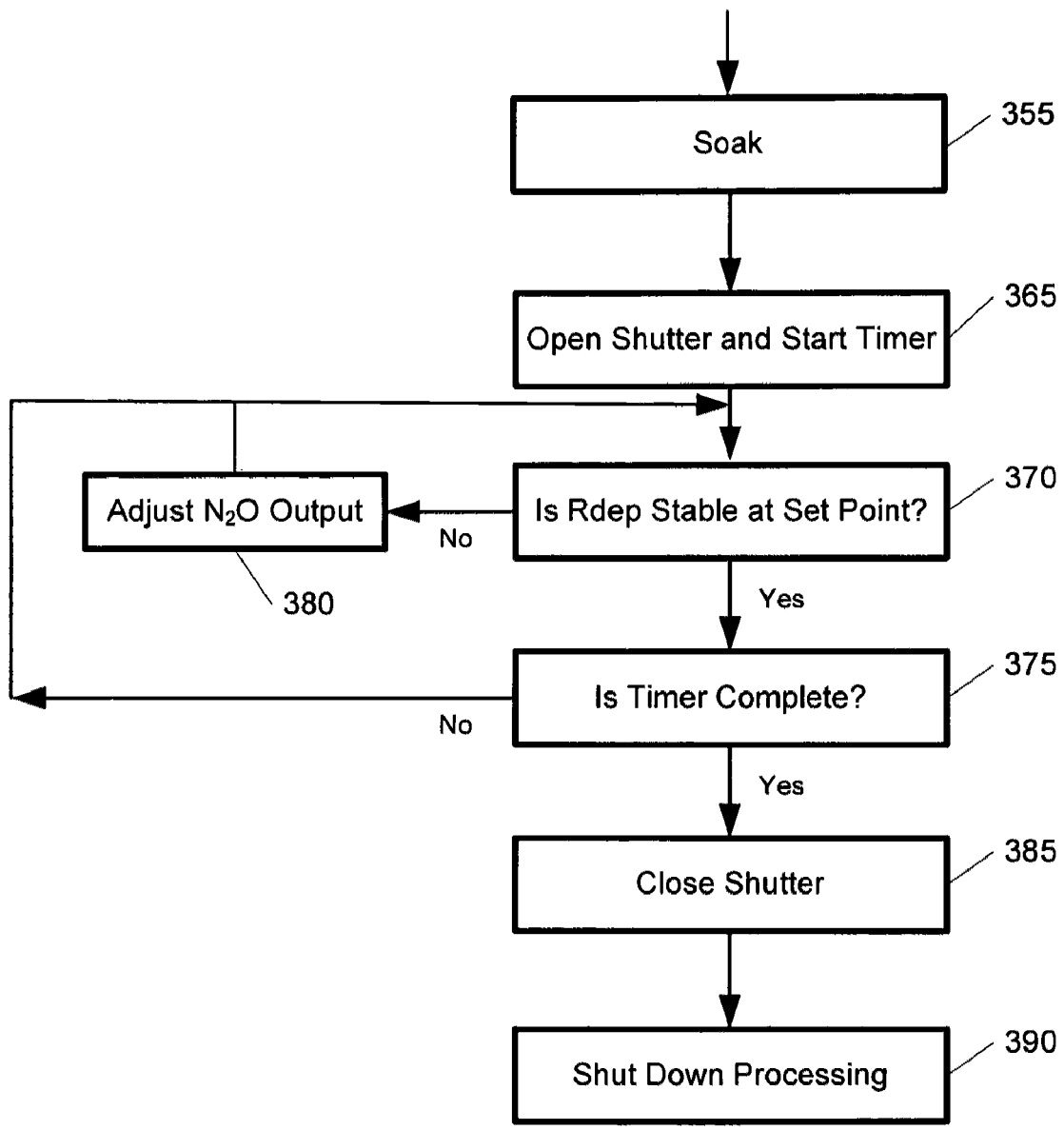

As noted above, the process modifying additive gas and the process reactant gas may be the same gas. For example, $N_2O$, NO, $NO_2$, and $NO_3$, or a combination thereof, may be used. FIGS. 3A and 3B show an example of a deposition process in which the process modifying additive gas and the process reactant gas are the same gas, referred to as simply the process gas, for the purpose of describing FIGS. 3A and 3B. The example of FIGS. 3A-3B is similar to the example of FIGS. 2A and 2B. It should be understood that the principles discussed above in connection FIGS. 2A-2B may be applied in connection with FIGS. 3A-3B.

At step 305, a flow of the process gas, in this example $N_2O$, is established in the process chamber. Using a physical vapor deposition machine, such as machine 10 of FIG. 1, this flow may be in the range of 1 to 16 sccm of $N_2O$, or more particularly, 2 to 8 sccm, for example. At step 310, a vanadium target 148 is sputtered with argon ions ($Ar^+$), similar to the process shown in FIGS. 2A and 2B. The $N_2O$ flow is then changed to a second level at step 320. At step 325, the deposition rate of $VO_x$ may be measured and, at step 330, the controller 100 determines whether the measured deposition rate $R_{dep}$ has reached a preset value. If the preset value has been reached, then a feedback control loop is established at step 335 between $N_2O$ flow and the measured deposition rate $R_{dep}$. If the preset value was not reached, then at step 340 the controller 100 determines whether a stabilization timer has expired. If the stabilization timer has not expired, then the process returns to step 325. If controller 100 determines that the stabilization timer has expired, then the process is stopped at step 345.

After establishing the feedback control loop at step 335, the controller 100 determines whether the deposition rate $R_{dep}$ is stable at step 350. If so, an additional waiting period (e.g., 900 seconds) may be allowed at step 355. If the deposition rate $R_{dep}$ is not stable at the desired value, then the $N_2O$ flow is adjusted at step 360, e.g., using a mass flow controller, after which the process returns to step 350. The loop is repeated until the deposition rate $R_{dep}$ is stable at the desired setpoint value.

After the soak step 355, the substrate shutter 152 is opened and a timer is started at step 365. At step 370, the deposition rate $R_{dep}$ is monitored and evaluated. If the deposition rate is stable, then the controller 100 determines whether the timer has expired at step 375. If the deposition rate is not stable, the N₂O flow is adjusted at step 380, e.g., using the mass flow controller, after which the process returns to step 370. If at step 375, the controller 100 determines that the timer has expired, then the shutter 152 is closed at step 385 and the deposition is completed. At step 390, a shut down may be performed. If the timer has not expired, the process returns to step 370.

It should be appreciated, regarding FIGS. 2A, 2B, 3A and 3B and the descriptions thereof, that methods of the invention can be implemented in analog electronic or mechanical sequencing, digital electronic logic, and/or software code with appropriate hardware interfaces. In these and other such implementations, the possibility exists of combining, omitting, adding, delaying, speeding up, etc. steps or choices among steps, including executing multiple steps/choices concurrently, without departing from the present invention.

One of the advantages of the disclosed processes relative to conventional processes is the ability to achieve stable deposition of high quality $VO_x$ material at higher deposition rates, for example, at least 20 or 25 Å per minute, and more particularly 50-240 Å per minute or more. Conventional processes that can deposit $VO_x$ material at comparable rates tend to be unstable, as noted above, while some other reported processes have significantly lower deposition rates.

Figure 4A:
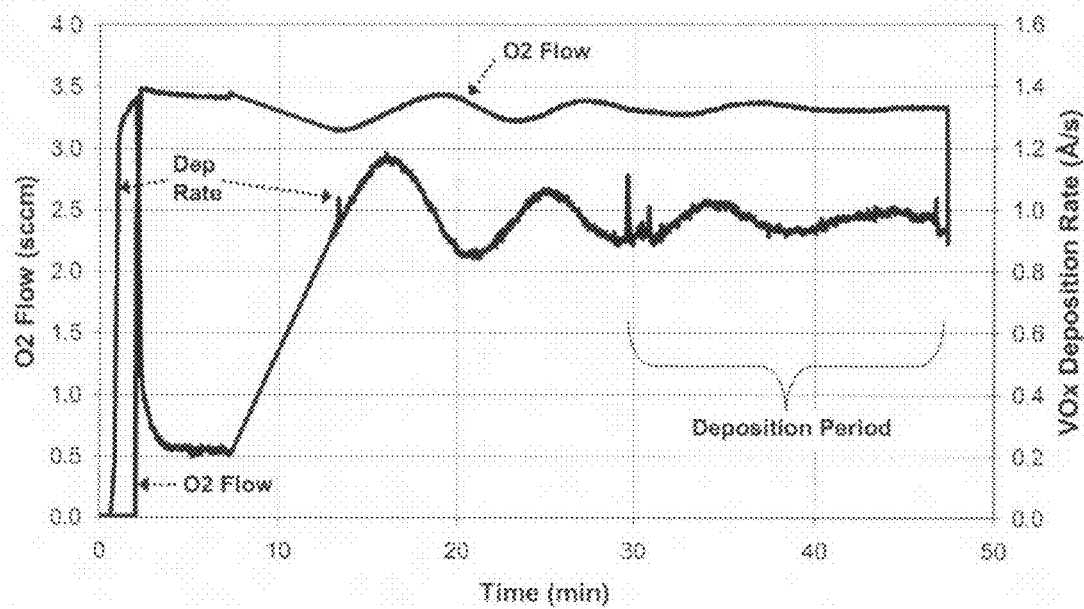
FIG. 4A provides a plot of $O_2$ flow and $VO_x$ deposition rate measured during an example of a deposition process according to a conventional process, to yield a material with resistivity of ~0.7 Ω·cm.

FIG. 4A illustrates a plot of $O_2$ flow (sccm) and $VO_x$ deposition rate (Å/sec) measured during example "10F" of a deposition process performed in a PVD machine 10 similar to that shown in FIG. 1 according to a flow chart similar to that of FIGS. 2A and 2B. Values of $O_2$ flow and $VO_x$ deposition rate were sampled and recorded once per second by controller 100. The sputter deposition ion source 140 was a radio-frequency-excited, 2-grid Kaufman-type source with 12 cm diameter grids and was set at constant ion beam output parameters of $V_{beam}$=900 eV and $I_{beam}$=275 mA to bombard vanadium target 148, and these same parameters were used in all three examples presented herein. In deposition run "10F" corresponding to FIG. 4A, a process modifying additive was not used, thus making this run representative of conventional processes. It should be noted that the observed deposition rate decreases with increasing $O_2$ flow rate, as seen dramatically in the first 7 minutes of the run depicted in FIG. 4A. This phenomenon has been attributed to "target poisoning" by adsorption or chemical reaction of oxygen on/with the material on the surface of the sputter target, which reduces the sputter yield of atoms on the surface of the target. See D. C. Carter, W. D. Sproul and D. J. Christie, "Effective Control for Reactive Sputtering Processes," Vacuum Coating and Technology, Vol. 7, No. 4, pp. 60-67 (April 2006). Thus the feedback loop described in relation to FIGS. 2A and 2B, which stabilizes the deposition rate by varying the $O_2$ flow, operated in the sense of increasing the $O_2$ flow to reduce the deposition rate and vice versa.

Figure 4B:
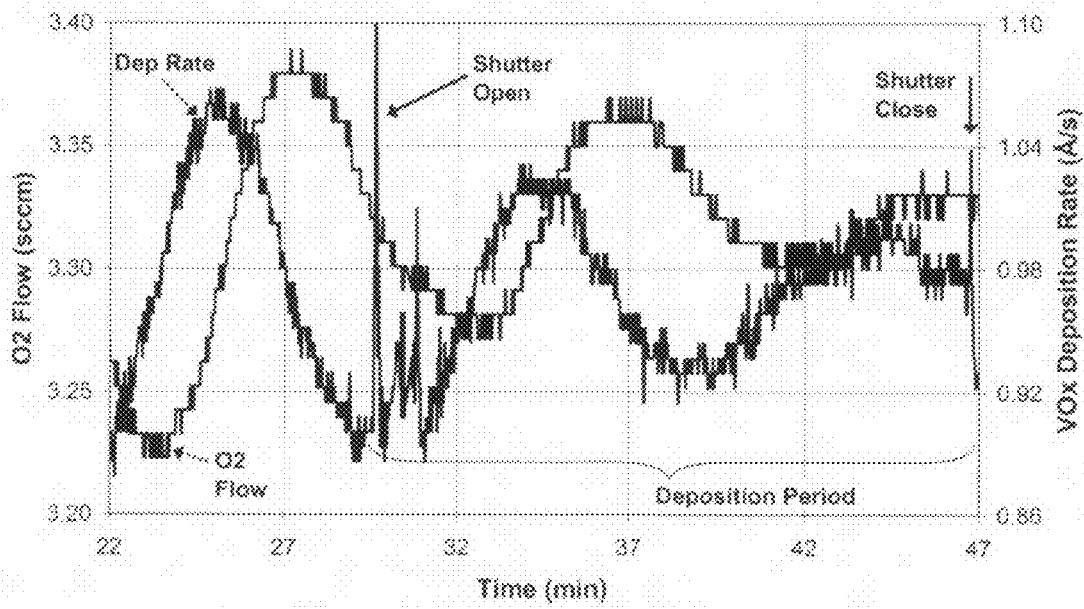
FIG. 4B provides a close-up of a portion of the plot of FIG. 4A.

FIG. 4B shows a portion of the $VO_x$ deposition steps of FIG. 4A with expanded plotting scales. As shown in FIGS. 4A and 4B, neither the $O_2$ flow (sccm) nor the $VO_x$ deposition rate became stable during the $VO_x$ deposition step. As an indication of the extreme sensitivity of the process to minor perturbations, it may be useful to note that in all of the example runs presented herein, a residual gas analyzer (RGA) mass spectrometer was operated and set to monitor mass 32 a.m.u. (i.e., $O_2$ gas), but the parameter changes shown in FIG. 4B were not reflected in any $O_2$ partial pressure variations detectable within the noise and resolution limits of the particular RGA used; hence those data are not shown. In the example of FIGS. 4A and 4B, the nominal value of the $VO_x$ deposition rate, ~0.97 Å/sec, was chosen based upon previous experimentation to obtain $VO_x$ material with resistivity of ~0.7 Ω·cm. The resultant $O_2$ flow, as controlled by the feedback loop described in relation to FIGS. 2A and 2B, averaged 3.32±0.03 sccm, where the uncertainty is a $\sigma_{n-1}$ standard deviation. The peak-to-peak excursion of the $O_2$ flow was 0.1 sccm during the actual deposition step, which is considered unstable for this type of (ideally) precise deposition process. The desired resistivity of ~0.7 Ω·cm is in the range of values that are extremely difficult to obtain by conventional processes. In fact, other runs nominally the same as or similar to "10F" in the same PVD machine resulted in instabilities of the process parameters much worse than shown in FIGS. 4A and 4B, and the $VO_x$ films resulting from such runs did not have the desired resistivity and were considered nearly worthless because of probable variations in $VO_x$ properties caused by the process instabilities. Instability phenomena similar to these are commonly observed in conventional processes, especially when $O_2$ flow is reduced in order to attempt to produce $VO_x$ of lower resistivity than ~1.0 Ω·cm. Dozens of runs were attempted, with and without operator intervention, with many different choices of proportional-integral-differential (PID) feedback loop parameters, and in many runs instabilities were observed. In some runs, "runaway" loss of control of some parameters occurred. The term "runaway" means that the control loop was insufficient to restore the required deposition rate and $O_2$ flow values before the deposited material was ruined, i.e., a significant thickness was deposited at unwanted parameter values. It is believed that the observed instabilities are indicative of extreme, inherent process sensitivities and are not indicative of faulty equipment or an inadequate control scheme.

Figure 5A:
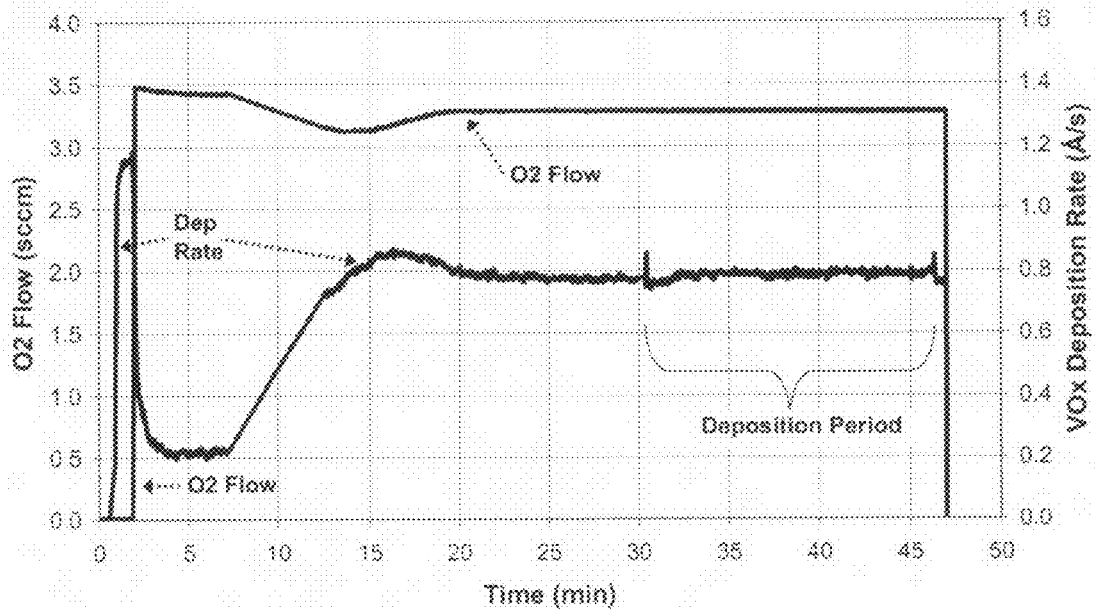
FIG. 5A provides a plot of $O_2$ flow and $VO_x$ deposition rate measured during an example of a deposition process according to the present invention, to yield a material with resistivity of ~0.7 Ω·cm.

FIG. 5A shows values of $O_2$ flow and $VO_x$ deposition rate measured during example "09J" of a deposition process performed in the same PVD machine 10 used for FIG. 4A according to the flow chart of FIGS. 2A-2B. The process modifying additive gas for this deposition run "09J" was $N_2$, and the $N_2$ flow rate was set constant at 0.65 sccm, thus making this run representative of the present invention (though the invention also includes cases in which the quantity of process modifying additive is varied during a run). The same process system and the same instrumentation were used to produce the data for FIGS. 4A and 5A. As with the "10F" example, the target poisoning effect of oxygen is clearly seen in this "09J" case. Again, the value of the $VO_x$ deposition rate, ~0.79 Å/sec, was chosen to based upon previous experimentation to obtain $VO_x$ material with resistivity of ~0.7 Ω·cm, which is in the range of values that are extremely difficult to obtain by conventional processes. The resultant $O_2$ flow, as controlled by the feedback loop described in relation to FIGS. 2A and 2B, averaged 3.277±0.005 sccm, where the uncertainty is a $\sigma_{n-1}$ standard deviation. The peak-to-peak excursion of the $O_2$ flow was 0.01 sccm during the actual deposition step, which is considered quite stable for this type of precise deposition process. It should be understood that the set-points and observed numeric values for all parameters in the three process examples presented herein could vary within the practice of the present invention due to, e.g., use of a different pumping speed, a different target-to-substrate distance, a different size or type of ion source, a different desired resistivity and, of course, a different family of materials other than $VO_x$.

Figure 5B:
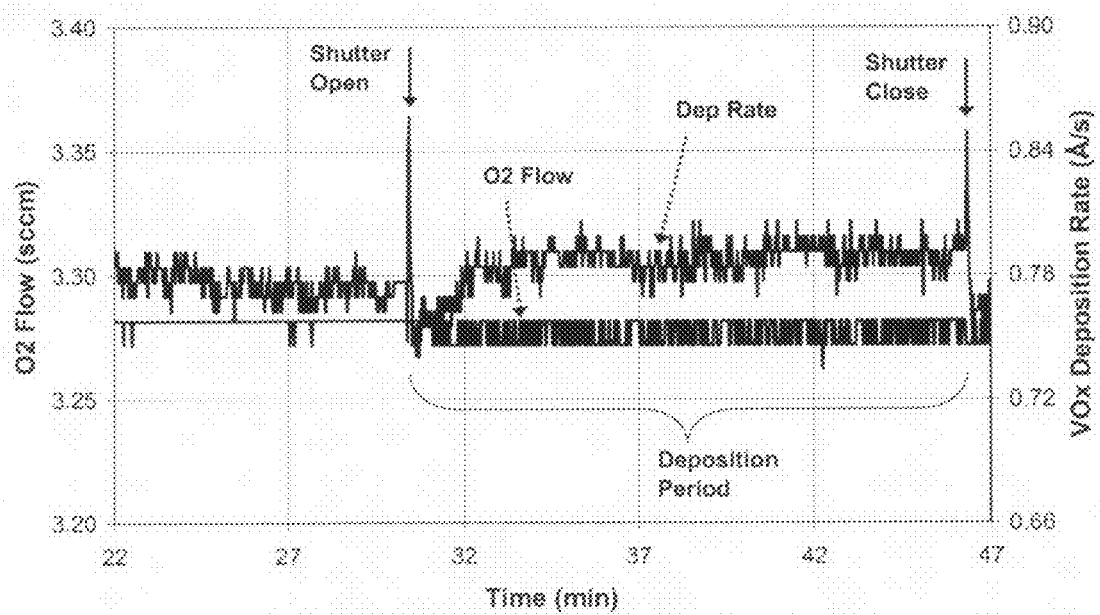
FIG. 5B provides a close-up of a portion of the plot of FIG. 5A.

FIG. 5B shows of a portion of the $VO_x$ deposition steps of FIG. 5A with expanded plotting scales. As can be seen, especially in FIG. 5B, both the $O_2$ flow and $VO_x$ deposition rate became stable during the $VO_x$ deposition step. In this case, the $O_2$ flow and $VO_x$ deposition rate are nearly as stable as the instruments used could measure. Experience has shown that, using a process modifying additive according to the present invention, not only stable but also reproducible run-to-run deposition processes can be achieved to produce $VO_x$ films with resistivity value less than 1.0 Ω·cm. Moreover, the behavior shown in FIGS. 5A and 5B is very suitable for automated processing with no operator intervention during the process.

Figure 6A:
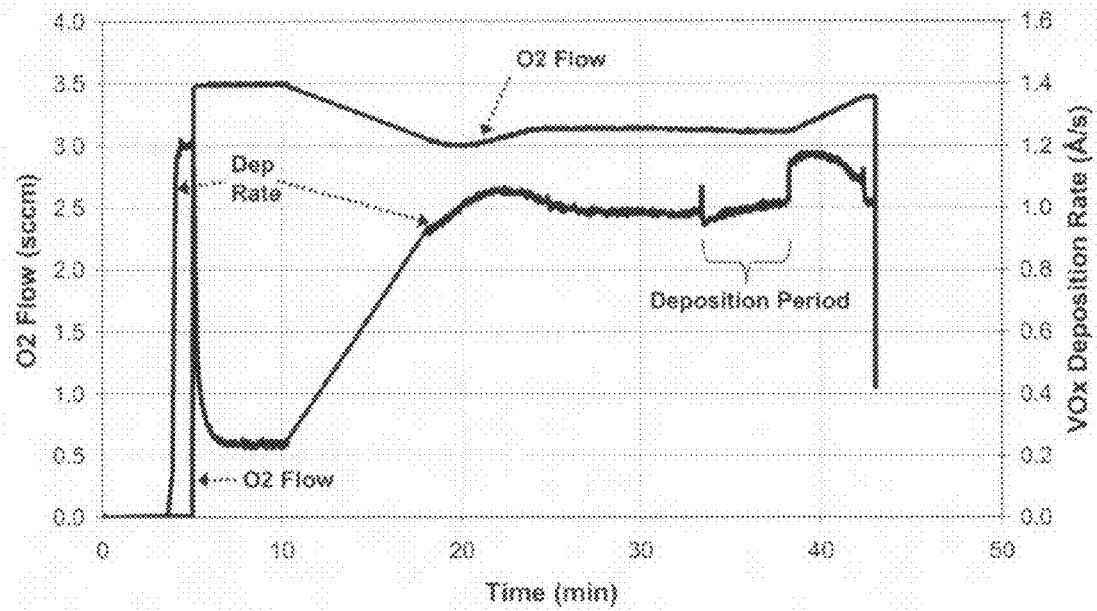
FIG. 6A provides a plot of $O_2$ flow and $VO_x$ deposition rate measured during an example of a deposition process according to the present invention, to yield a material with resistivity of ~0.07 Ω·cm.

FIG. 6A shows values of $O_2$ flow and $VO_x$ deposition rate measured during example "15G" of a deposition process performed in the same PVD machine 10 used for FIGS. 4A and 5A according to the flow chart of FIGS. 2A-2B. The process modifying additive gas for this deposition run "15G" was $N_2$, and the $N_2$ flow rate was set constant at 0.65 sccm, thus making this run representative of the present invention. The main difference between the "15G" case and the "10F" and "09J" cases was that the value of the $VO_x$ deposition rate, ~0.99 Å/sec, was chosen to based upon previous experimentation to obtain $VO_x$ material with resistivity of ~0.07 Ω·cm, which is in the range of values that are at a minimum difficult to obtain by conventional processes. The resultant $O_2$ flow, as controlled by the feedback loop described in relation to FIGS. 2A and 2B, averaged 3.117±0.006 sccm, where the uncertainty is a $\sigma_{n-1}$ standard deviation. The peak-to-peak excursion of the $O_2$ flow was 0.029 sccm during the actual deposition step, which is considered acceptably stable for this type of precise deposition process.

Figure 6B:
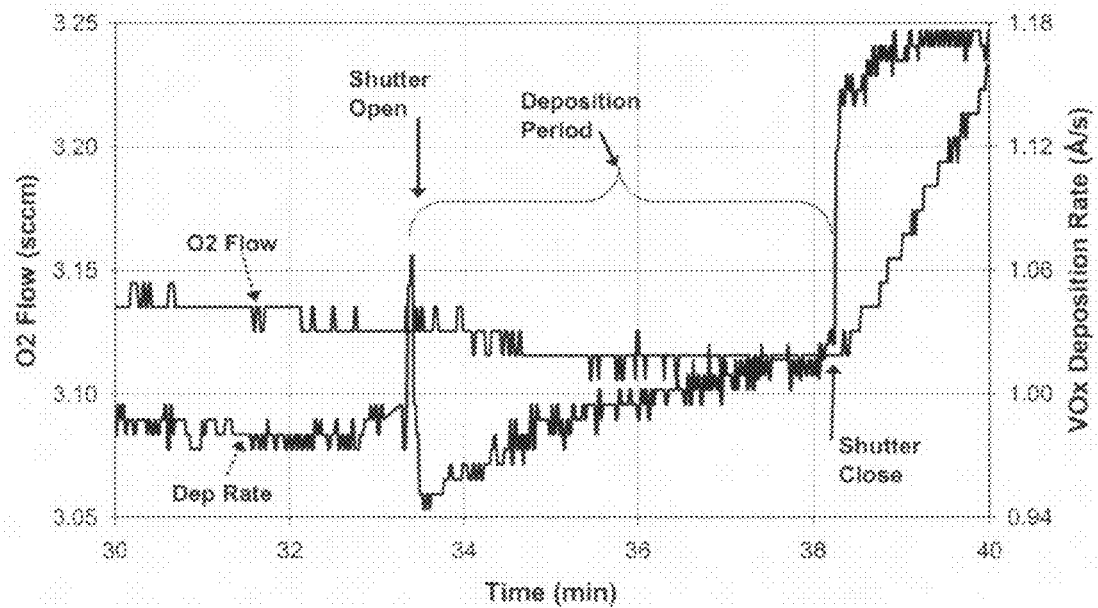
FIG. 6B provides a close-up of a portion of the plot of FIG. 6A.

FIG. 6B shows of a portion of the $VO_x$ deposition steps of FIG. 6A with expanded plotting scales. As can be seen, especially by comparison with FIG. 5B, there is some instability of the parameters in case "15G". These are associated with the opening and closing of the substrate shutter, at times ~33.35 and 38.25 minutes, respectively. It is thought that the observed "transients" in the signals are due to sudden exposure of surface area (i.e., the substrate, its retainer and close surroundings, which had not been previously "conditioned" or reached steady-state regarding $VO_x$ deposition and oxygen uptake rate, It is known from experience that, in the absence of the process modifying additive, at deposition rate and $O_2$ flow conditions necessary to achieve resistivity of ~0.07 Ω·cm, a) the time period (from 28 to 33 minutes into the run) of relative stability before the shutter opened could not have been achieved and b) the shutter-opening transient would have thrown the process into "runaway" instability regarding the deposition rate and $O_2$ flow values. This behavior points up two deficiencies of conventional processes: their extreme sensitivity to small, sudden perturbations in local substrate 154 and shutter 152 surface effects and their long time constant (minutes) for settling of chamber 112 ambient and environment effects. The sensitivity to local effects, such as the substrate shutter opening, is shown by considering that the area suddenly exposed was ~400 cm² compared with the area of the remainder of the chamber, which had been previously "conditioned", which was ~4 m²=40,000 cm². This is an ~1% perturbation in surface area. The long time constant (minutes) for settling of parameters is observable in FIGS. 4A, 5A and 6A and appears to be characteristic of this type of chamber and vapor deposition process, not a result of improper equipment or controls, as discovered through numerous trials mentioned earlier. One aspect of the present invention addresses these deficiencies of conventional processes.

TABLE 1

Correlation of $VO_xN_y$ Resistivity, Film Composition, and Process Parameters

| | | | Process Parameters and Conditions | | | | | | |
|---|---|---|---|---|---|---|---|---|---|
| Run ID | Rho (Ω·cm) | Rho Non-Unif % | Avg $O_2$ flow (sccm) | Std Dev $O_2$ flow | $O_2$ flow +/- % instability | $N_2$ flow (sccm) | Avg Rdep (Å/s) | Std Dev Rdep | Rdep +/- % instability |
| 10F | 0.722 | 1.636% | 3.3187 | 0.0252 | 0.76% | 0 | 0.969 | 0.032 | 3.27% |
| 09J | 0.575 | 1.578% | 3.2769 | 0.0049 | 0.15% | 0.653 | 0.786 | 0.011 | 1.45% |
| 15G | 0.075 | 0.617% | 3.1172 | 0.0059 | 0.19% | 0.653 | 0.992 | 0.021 | 2.09% |

| | Film Composition, SIMS, RBS and NRA Atomic Percent (%) | | | | |
|---|---|---|---|---|---|
| Run ID | V | O | Ar | N | Total |
| 10F | 43.90% | 52.30% | 3.67% | 0.13% | 100.0% |
| 09J | 36.17% | 58.21% | 2.45% | 3.18% | 100.0% |
| 15G | 44.10% | 47.57% | 3.25% | 5.09% | 100.0% |

In operation, the present invention, when practiced according to the method of FIGS. 2A-2B, has produced $VO_x$ films, and particularly $VO_xN_y$ films, having desirable and advantageous properties. Table 1 summarizes the process parameters, the resultant resistivities and the film compositions measured for each of the three examples discussed above. Note that the three example cases, denoted "10F", "09J' and "15G" in Table 1, are the same as discussed above, with "10F" corresponding to FIGS. 4A-4B, "09J" corresponding to FIGS. 5A-5B and "15G" corresponding to FIGS. 6A-6B.

In the process examples shown in Table 1, the average $O_2$ rate is noted in column 4. As described above, the $O_2$ flow rate is regulated and thus varies to some extent over the course of the deposition process. The standard deviation of the $O_2$ flow rate is indicated in column 5 of Table 1. Column 7 indicates the $N_2$ flow rate. As reflected in the "09J" and "15G" examples, the $O_2$ flow rate is greater than the $N_2$ flow rate and, more particularly, about 5 times the $N_2$ flow rate.

Within the three example cases chosen, all $VO_x$ films were grown to a thickness useful for microbolometer infrared sensing applications, e.g., 50-100 nm thick. All three example films have a temperature coefficient of resistivity (TCR) of ~2.0% which is useful for microbolometers. The first two examples listed in Table 1, Run IDs "10F" and "09J", were chosen to have a resistivity of ~0.7 Ω·cm. The third example, "15G", was chosen to have a resistivity of ~0.07 Ω·cm, which is well below the resistivity achievable while still retaining an acceptably stable and reproducible process according to conventional techniques. All resistivity values were measured as sheet resistance ($R_s$) using a Tencor/Prometrix RS55 4-point probe resistivity mapper, calibrated with a Tencor model 500011 resistor pack, and are the average of 49 measured points uniformly distributed across a 150 mm diameter silicon wafer substrate having 500 nm of thermally grown $SiO_2$ between the Si substrate and the deposited film. Sheet resistance values were converted to resistivity according to the formula Rho=$R_s$*t, where t, the film thickness, was measured by a Tencor P12 stylus profilometer. As noted above, the first example, "10F", does not use the present invention, while the second and third examples, "09J" and "15G" do use an embodiment of the present invention.

Quantitative compositional analysis of the three example $VO_x$ films was performed by a combination of SIMS (secondary ion mass spectrometry) sputter depth profiles and calibration of the SIMS using RBS (Rutherford Backscattering Spectrometry) and NRA (Nuclear Reaction Analysis). The SIMS depth profile gives meaningful relative signals for four elements found in the example films (V, O, N and Ar). It is noted that small amounts of Ar may be found in sputtered PVD films when Ar is used in the process as the sputtering gas. RBS gave absolute quantification of V, Ar and O+N, but did not resolve the combined O+N signal because the atomic masses were too close to each other. NRA was used to quantify the N content, and then the combined RBS and NRA results were used to calibrate the SIMS depth profiles. FIG. 7 shows the SIMS depth profile from case "15G". The film compositions shown in Table 1 are the depth-average of the calibrated SIMS signals throughout the bulk of the film, away from either the vacuum-adjacent surface of the film or the substrate-to-film interface, both of which are subject to distortions in the SIMS depth profile signals due to contamination, intermixing of distinct layers and other expected experimental artifacts. It is possible that hydrogen (H) may be found in small amounts in the films, but no analysis for H content was performed. The presence of H could have some small, measurable effect and should not be excluded from the scope of the present invention.

The results obtained from these three example cases show two very clear phenomena. One is the effect of the $N_2$ additive on stabilizing the process and the other is the effect of the $N_2$ additive on introducing N into the $VO_x$ material. The amount of N in the material can vary. For example, the amount of N may exceed 0.2 atomic %, 0.5 atomic %, and in some embodiments may exceed at least 0.7 atomic % and at least 1 atomic %, and may be at least 3 atomic %. Concomitant with introducing N into the $VO_x$ material was a dramatic decrease in the resistivity of the material. These two phenomena together achieve a stable process to produce $VO_x$ material with desirably reduced resistivity, e.g., 0.07 Ω·cm versus ~0.7 Ω·cm while maintaining other desired properties of $VO_x$, such as high TCR around 2% useful for microbolometer sensors. As mentioned, obtaining $VO_x$-type material with resistivity values much below 0.7 Ω·cm is impractically unstable using conventional processes on a production scale, e.g., 150 mm CMOS wafers. However, in accordance with the principles disclosed herein, resistivity values of about 0.01-10.0 Ω·cm may be achieved, and resistivity values less than 0.1-1.0 Ω·cm may be achieved without significant instability in the deposition process.

Considering in more detail the first of these two phenomena, the process modifying additive, continuously flowing N2 gas, stabilizes the deposition process. This stabilization is evident by comparing the vertical axes of FIGS. 4A-6B. The left vertical axis shows the $O_2$ gas flow rate and the right vertical axis shows the deposition rate ($R_{dep}$) near the substrate. The span of the vertical scales is the same in FIGS. 4A-6A. In FIGS. 4B-6B, the scales are expanded relative to their "A" counterparts, but the span among the "B" scales is the same, though their vertical offsets are different. FIGS. 4A and 4B show the case "10F" in which no flowing $N_2$ gas was used. FIGS. 5A and 5B show the case "09J" which was identical to case "10F" except that a flow of 0.678 sccm of $N_2$ gas was used and the deposition rate was set slightly lower. Comparing especially FIGS. 4B and 5B in the region of each between the transient signals due to the substrate shutter opening and closing, it is apparent that the case without $N_2$ flow exhibits much more variation in the $O_2$ flow and $R_{dep}$ signals than the case with $N_2$ flow. Electronic controls were used in an effort to hold other machine parameters in the deposition system constant and the feedback loop was engaged to keep $R_{dep}$ constant at its setpoint value by adjusting the $O_2$ flow. Thus all variation in the $O_2$ flow and $R_{dep}$ signals was unwanted, in both cases. This variation in the $O_2$ flow and $R_{dep}$ signals is listed numerically in Table 1, in the first and second rows of data for the "10F" and the "09J" cases, respectively.

Columns 4 and 8 show the average of the $O_2$ flow and $R_{dep}$ signals, respectively, over the time interval during which the substrate shutter was open to allow deposition. The standard deviations ($\sigma_{n-1}$) of the averages are shown in columns 5 and 9. The degree of instability observed in the signals is quantified by the ratio $\sigma_{n-1}$/average expressed as a percentage of the average, which are shown in columns 6 and 10. The process instability is about five times worse for $O_2$ flow and about two times worse for $R_{dep}$ in the case "10F" without $N_2$ flow versus the case "09J" with $N_2$ flow. In reality, from laboratory experience, case "10F" is actually very near the practical limit of stability, meaning that a) only by "chance" did the much larger instability oscillations observed earlier in time in FIG. 4A damp down to something barely acceptably stable (i.e., other similar example cases did not damp to stability, for reasons that are unclear) and/or b) there is a response surface nearby in parameter space that is not adequately represented by mere factor of two or factor of five difference in the example numerical measures of relative stability, and minor "wandering" on this surface can easily result in "parameter runaway" failure of the $O_2$ flow feedback loop; such runaway of $O_2$ flow, either to very high or very low $O_2$ flow, disturbs the deposition system entirely from the desired $VO_x$ growth regime and proper growth conditions cannot be recovered before ruining the substrate with poor-quality $VO_x$ deposits. In other words, case "10F" is an atypical instance of a process that suffers from run-to-run reproducibility problems.

In the second of these two phenomena, the process modifying additive, continuously flowing $N_2$ gas, introduces N into the $VO_x$ material and dramatically decreases the resistivity of the material. This is seen most clearly in Table 1 by comparing the first and third rows of data for the "10F" and the "15G" cases, respectively. Column 2 shows that the resistivity of the "15G" case is about ten times less than the "10F" case. Comparing columns 11, 12 and 14 for those two cases/rows shows that the V composition is about the same and the sum of O+N composition is also about the same, for the two cases. Clearly the substitution of ~5% N for (i.e., removal of) ~5% O in the "15G" case relative to the "10F" case accounts for the change in resistivity. Further evidence of added N decreasing the resistivity of $VO_x$-type materials is given in the second row of Table 1, the "09J" case. In that case compared with the "10F" case, the addition of only ~3% N had to be compensated by an ~8% reduction in the V concentration and an ~6% increase in the O concentration, in order to maintain the relatively high resistivity of ~0.7 Ω·cm.

Also shown in Table 1 is the improvement that a process modifying additive can make regarding the uniformity of thin film material properties across a substrate. For the three examples, "10F", "09J" and "15G", column 2 shows the film resistivity and column 3 shows the non-uniformity of resistivity calculated as $\sigma_{n-1}$ standard deviation of the resistivity divided by the average resistivity, expressed as a percentage, where n=49 sampling sites were measured approximately equally-spaced over 150 mm diameter wafers with a Tencor/Prometrix RS55 4-point probe resistivity mapper. The process modifying additive gives some improvement in "09J" compared to "10F" without additive. In "15G" the resistivity uniformity has improved by almost three times with additive compared to "09J" without additive. However, as stated above, a run like "15G" that does not use a process modifying additive, but gives a film resistivity of 0.07 Ω·cm would not have been practical due to instability of the deposition process.

Experience has shown that cases similar to "10F" in which the process did not stabilize yielded resistivity non-uniformities far worse than the ±~1.6% of "10F", so the ±~0.6% non-uniformity of "15G" using the process modifying additive $N_2$ is a remarkable improvement. Moreover, in general, $VO_x$ resistivity uniformity on larger wafers (150 mm, 200 mm and larger) gets worse as resistivity is pushed to lower values. Therefore, the ±~0.6% non-uniformity of "15G" at 0.07 Ω·cm is a surprisingly good result.

FIG. 8 shows another aspect of the resistivity uniformity improvement from using a process modifying additive gas, such as $N_2$, and also by controlling the points of entry of the reactive gas into the chamber. FIG. 8 shows the sheet resistance ($R_s$) measured across a diameter of four 200 mm wafers, each having an ~90 nm thick layer of $VO_x$. The $VO_x$ on these wafers was deposited using the process of FIGS. 2A and 2B and Table 1 for samples "03CZ" and "18F" and a similar process without a process modifying additive for samples "26G" and "23B", except that for samples "03CZ", "26G" and "23B" the $O_2$ reactant gas flow was split between two points of entry, the (default) process chamber 112 background and the interior of deposition ion source 140. Note that ion source 140 was used to sputter V target 148, so this source was "activated" in the sense that its radio-frequency (RF) plasma generation function was turned on. Also ion source 140 by default ionizes a portion of the Ar sputtering gas to provide $Ar^+$ ions with which to sputter the target, and in these examples this flow of Ar was not decreased when $O_2$ reactant was added to the gas flow into the activated ion source. Under these conditions, the RF plasma inside source 140 and activated ion source 140 as a whole will produce not only accelerated $Ar^+$, $O_2^+$ and $O^+$ ions but will also liberate into chamber volume 112 non-accelerated neutral species such as Ar*, $O_2$*, O, O*, $O_3$ and $O_3$*, where the "*" designates vibrationally and/or electronically excited molecular species as appropriate, as well as thermal non-ionized feed gases, i.e., Ar and $O_2$.

In the case "26G", the $O_2$ flow was run exclusively through activated ion source 140. In all cases, the total $O_2$ flow was much greater than the $N_2$ flow, if any, similar to Table 1. $VO_x$ deposition rates were chosen based upon previous experimentation to achieve films with resistivity of 0.22±0.04 Ω·cm. All $R_s$ values were normalized to 1.0 at the center of the wafer for the sake of comparison in FIG. 8. The non-uniformity of $R_s$ was determined by a 49-site sampling of the Tencor/Prometrix RS55 4-point probe resistivity mapper (for clarity only 7 diameter sites are plotted in FIG. 8), but it should be noted that the physical (mechanical) thickness of all $VO_x$ films was uniform across each wafer to within 2%. Samples "03CZ" and "18F" using a process modifying additive show little effect of point of entry of the $O_2$ reactant gas.

These two samples show 49-site $R_s$ non-uniformities of 1.5% and 3.6%, respectively, and the center-to-edge "sense" of the non-uniformity is the same, implying only a 2% change due to point of entry of the reactant $O_2$. Thus the process modifying additive makes the process "less sensitive" not only to time-domain parameter instabilities (compare FIGS. 4B and 5B) but also to spatially-varying (non-uniform) chemical reactivity patterns. By contrast, without the process modifying additive for samples "26G" and "23B", the Rs non-uniformity was 14.4% and 9.2%, respectively, and the center-to-edge "sense" of the non-uniformity was reversed, implying an ~25% change due to point of entry of the reactant $O_2$.

In addition, it has proven possible (not plotted) to adjust the relative amount of $O_2$ reactant flow between the chamber background and activated ion source points of entry so as to "cancel out" the opposite senses of the non-uniformities shown for "26G" and "23B" and arrive at quite small non-uniformities across the wafer, as little as 3%, as little as 2% and as little as 1%, at resistivity values at most 0.3 Ω·cm, and more particularly at resistivity values of less than 0.25, and even less than ~0.2 Ω·cm. This is a surprising result given that a) no such effect is observed in the presence of $N_2$ process modifying additive and b) no such effect was observed when the entry point of the reactant $O_2$ gas was put at several other ports of chamber 110. In particular, very little effect on uniformity was observed when the $O_2$ point of entry was the non-activated ion source 160, the preclean/ion-assist source. This result suggests that the excitation, fragmentation and/or chemical change (e.g., to $O_3$) of the $O_2$ by an activated plasma or ion source, such as 140, may contribute to the improvement in resistivity uniformity, rather than being solely a point-of-entry effect. Using the techniques described herein, non-uniformities of resistivity of less than 3.0%, and more particularly, between 0.5% and 2.0%, can be achieved over regions having a diameter of 130 mm or more (e.g., for 150 mm wafers), and even 180 mm or more (e.g., for 200 mm wafers).

While the present invention has been described in detail with reference to an ion beam sputter (IBS) deposition machine and a simple gaseous process modifying additive in FIG. 1, method flow charts in FIGS. 2A, 2B, 3A and 3B and example process data from an IBS machine in FIGS. 4A, 4B, 5A, 5B, 6A, 6B, 7 and 8 and Table 1, it will be understood that aspects of the invention may be implemented in different types of deposition machines and with different types of process modifying additives. In at least one aspect of the invention, the adding of nitrogen to $VO_x$ to reduce resistivity, it would be possible to sputter a vanadium nitride (CAS #24646-85-3) target in place of a vanadium target, while still using $O_2$ gas or some other oxygen-containing reactant gas to assure a $VO_xN_y$ composition. In this nitrided target implementation of the present invention, the process modifying additive is nitrogen, in the form of metal nitride, added to the sputter target itself. The loci-of-effect of the process modifying additive may be at least two-fold in this implementation. In the first place, the locus is the surface of the sputter target, and the effect may be to modify the low-energy processes such as adsorption (physisorption, chemisorption, dissociative adsorption, etc.) of the $O_2$ (or other) reactant process gas on the surface of the target. This will affect the chemical kinetics of oxidation of and subsequent changes in sputter yield of various species off of the target (including lateral variations of such). The reduction of chemical reactivity of $O_2$ with the target surface due to its being nitrided would benefit the stability of the process, one of the prime aspects of the invention, and the reduction in lateral variations of species-specific sputter yields across the target would benefit process uniformity, another main aspect of the invention. In the second place, the locus of effect may be the surface of the growing film on the substrate, and the effect may be the incorporation of sputtered N-atom vapor from the target into the growing film. In that case, the process modifying additive is also the sputtered N-atom vapor. The N incorporated into the growing film from the sputtered N-atom vapor will beneficially reduce the resistivity of the resultant film, another main aspect of the present invention.

Likewise, carbon added to $VO_x$ to produce $VO_xC_y$ may have a similar beneficial effect, and a vanadium carbide (CAS #12070-10-9) target could be sputtered to produce this material. As above, the amount of C in the material can vary. For example, the amount of C may exceed 0.2 atomic percent, 0.5 atomic %, and in some embodiments may exceed at least 1 atomic %, and may be at least 3 atomic %. Of course, with both nitrogen and carbon, suitable process modifying additive gases may be used. With carbon, however, the possibility of sputtering C-atom vapor from a pure carbon (e.g., graphite) target becomes possible, while still simultaneously sputtering from a pure V target. In this way, the ratio of V to C in the deposited film is readily controlled by varying the sputtering power to each target. To do this co-sputtering with an IBS deposition system may require two deposition ion sources 140 and other complications, so is not desirable. A better machine to accomplish co-sputtering would be based upon biased target deposition (BTD), in which a low-energy ion/plasma source floods one or more targets (and surrounding areas as well) with ions having too little kinetic energy to cause sputtering. A variable bias can be applied to the sputter target(s) to accelerate ions to the target surface to cause sputtering, as in U.S. Pat. No. 6,682,634, which is incorporated herein in its entirety by reference. The case of co-sputtering of multiple targets within BTD is the subject of U.S. Pat. No. 6,679,976 (which is incorporated herein in its entirety by reference). Also within the general family of BTD techniques, active or reactive neutral species can be generated by collisional neutralization and dissociation of ions at a target surface, as in U.S. Pat. No. 6,723,209 (which is incorporated herein in its entirety by reference), from gaseous species which might otherwise not be reactive or effective. In this technique, neutral species backscattered from the target may be the process modifying additive vapor of the present invention. The energetics can be arranged so that atoms from the target surface itself do or do not become sputtered and incorporated in the final $VO_x$ film. By arrangement of the process geometry within BTD, the sputtered or backscattered process modifying additive species from the target can be directed mostly toward the substrate, mostly away from the substrate to the chamber 112 and sputter target environment, or to both the substrate and the environment. Finally, as has been noted, metals other than vanadium, non-metals other than O and deposited materials other than $VO_x$ readily fall within the scope of the present invention by selection of appropriate target materials, process gases and process modifying additive species, as desired.

The present invention may be used to manufacture thin-film $VO_x$ layers for uncooled or room-temperature (~300K) bolometers. Bolometers may be used in infrared sensors used in a variety of applications. The $VO_x$ material forms the active layer of one type of bolometer, changing a physical property (e.g., electrical conductivity) as a function of heat content. Such a bolometer device holds a low-mass $VO_x$ layer in substantial thermal isolation from the ambient environment, so increased heat content correlates with higher temperature within the $VO_x$ layer, and performance of such a bolometer may be characterized via its temperature coefficient of resistivity (TCR). Such a bolometer is capable of responding to electromagnetic and/or particle radiation falling upon and absorbed by the $VO_x$ layer. More specifically, such bolometers may be incorporated into sensors and detectors for infrared radiation (700-20,000 nm wavelength).

Figure 9:
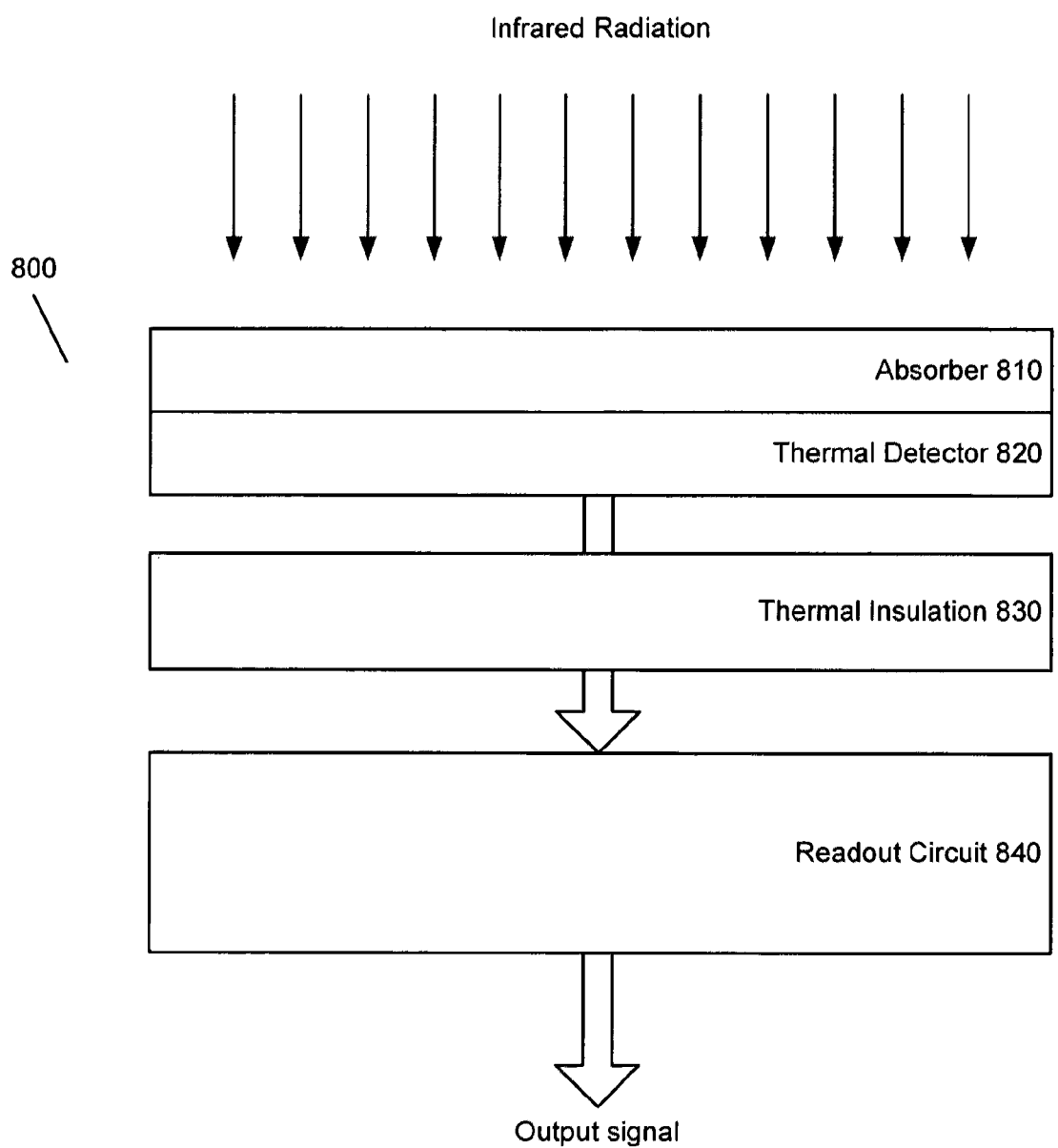

FIG. 9 provides a schematic of a thermal sensor 800 including a bolometer. The thermal sensor 800 includes an infrared absorber 810, a thermal detector 820, thermal insulation 830, and readout circuitry 840. The infrared absorber 810 serves to absorb infrared radiation and consequently generate heat. The heat is detected by a thermal detector 820, which includes a thin layer of $VO_x$ composed and/or manufactured in accordance with the invention as described above. In particular, the $VO_x$ layer may be composed of, for example, $VO_xN_y$, as described above. As noted above, the electrical resistance of the $VO_x$ layer changes according to changes in temperature. Thermal insulation 830 serves to thermally insulate the absorber 810 and the thermal detector 820, which, among other things, improves the sensitivity of the detection. The readout circuit 840 measures the resistance of the $VO_x$ layer, generating an electrical signal indicative of the resistance measurement and hence the infrared radiation absorbed. The thermal sensor 800 may be combined with other similar thermal sensors to form a sensor array, which can be used to generate infrared images.

Figure 10:
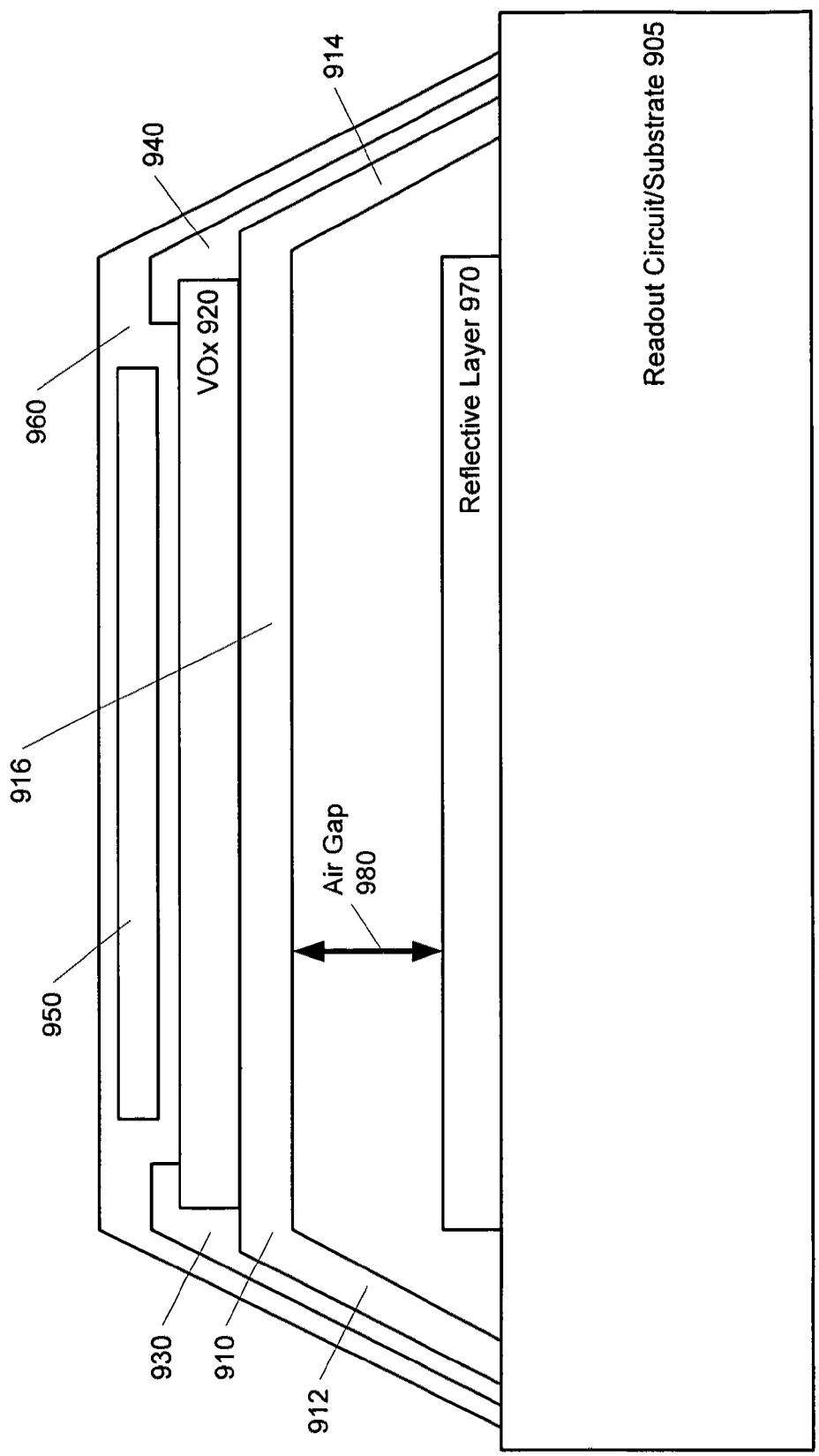
FIG. 10 provides a simplified illustration of layers of a solid-state infrared sensor.

FIG. 10 illustrates a simplified drawing of the layers of an example of a solid-state infrared sensor 900. It should be understood that the FIG. 10 is not drawn to scale. For example, the thicknesses of the layers are exaggerated. Moreover, as appreciated in the art, the view in FIG. 10 does not necessarily represent the cross-section of a single linear slice through the thermal sensor 900. The thermal sensor 900 includes a substrate 905 that includes a readout integrated circuit. It should be understood that the substrate 905 may include other structures, such as additional thermal sensors and/or other circuitry. The thermal sensor 900 further includes a support structure 910, a $VO_x$ layer 920 made as described herein, and having a described composition (e.g., $VO_xN_y$), wirings 930, 940, an infrared absorber 950, and protective coating 960. The support structure 910 may be formed by photolithographic techniques.

The support structure 910 provides a support for the $VO_x$ layer 920 and infrared absorber 950 for thermally isolating these elements. For example, the support structure 910 may include first and second beam portions 912, 914 that extend from the substrate 910 and a platform portion 916 that extends above the surface of the substrate 910 to produce an air gap 970 that provides thermal insulation. The $VO_x$ layer 920 may be provided on or above the support structure 910 and, particularly, the platform portion 916. The first wiring 930 couples to a first portion of the $VO_x$ layer 920 and the second wiring 940 couples to second portion of the $VO_x$ layer 920. The first and second wirings 930, 940 extend along the beam portions 912, 914, respectively, to electrically connect to the readout integrated circuitry on the substrate 905. Thus, the wirings 930, 940 may provide electrical connection between the readout circuit and the $VO_x$ layer 920.

The infrared absorber 950 is provided over the support structure 910 and, particularly, the platform portion 916, adjacent the $VO_x$ layer 920. A reflective layer 970 may be provided beneath the infrared absorber 950 to reflect infrared radiation passing through the absorber 950 back onto the absorber 950. For example, the reflective layer 970 may be provided beneath the support structure 910.

It will be apparent to those skilled in the art that various modifications and variations can be made without departing from the spirit or scope of the invention. Thus, it is intended that the present invention cover the modifications and variations of this invention provided they come within the scope of the appended claims and their equivalents.

We claim:

1. A method for manufacturing an amorphous vanadium oxide ($VO_x$) film, comprising:
   loading a substrate into a deposition chamber;
   flowing a first gas into the chamber, the first gas containing a reactive oxygen species;
   flowing nitrogen gas into the chamber; and
   vaporizing vanadium from a vanadium source while the first gas and the nitrogen gas are flowing into the chamber so as to deposit an amorphous $VO_x$ film on the substrate, where x>0.

2. The method for manufacturing an amorphous vanadium oxide ($VO_x$) film according to claim 1, wherein during deposition the substrate is maintained at a temperature no greater than 100° C.

3. The method for manufacturing an amorphous vanadium oxide ($VO_x$) film according to claim 1, wherein:
   the step of flowing the first gas into the chamber comprises flowing the first gas at a first regulated flow rate; and
   the step of flowing nitrogen gas into the chamber comprises flowing the nitrogen gas at a second regulated flow rate, wherein the first flow rate is greater than the second flow rate.

4. The method for manufacturing an amorphous vanadium oxide ($VO_x$) film according to claim 1, wherein the step of vaporizing vanadium from the vanadium target is performed by physical vapor deposition.

5. The method for manufacturing an amorphous vanadium oxide ($VO_x$) film according to claim 4, wherein the step of physical vapor deposition comprises plasma ion sputtering.

6. The method for manufacturing an amorphous vanadium oxide ($VO_x$) film according to claim 4, wherein the step of physical vapor deposition comprises ion beam sputtering.

7. The method for manufacturing an amorphous vanadium oxide ($VO_x$) film according to claim 4, wherein the step of physical vapor deposition comprises arc vaporization.

8. The method for manufacturing an amorphous vanadium oxide ($VO_x$) film according to claim 4, wherein the step of physical vapor deposition comprises biased target deposition.

9. The method for manufacturing an amorphous vanadium oxide ($VO_x$) film according to claim 1, wherein the first gas comprises oxygen ($O_2$).

10. The method for manufacturing an amorphous vanadium oxide ($VO_x$) film according to claim 1, wherein substrate comprises silicon.

11. The method for manufacturing an amorphous vanadium oxide ($VO_x$) film according to claim 1, wherein substrate comprises glass.

12. The method for manufacturing an amorphous vanadium oxide ($VO_x$) film according to claim 1, wherein substrate comprises plastic.

13. The method for manufacturing an amorphous vanadium oxide ($VO_x$) film according to claim 1, wherein the deposited $VO_x$ film is characterized by $0.5 \leq x < 2.0$.

14. The method for manufacturing an amorphous vanadium oxide ($VO_x$) film according to claim 2, wherein the deposited $VO_x$ film is characterized by $0.5 \leq x < 2.0$.

15. The method for manufacturing an amorphous vanadium oxide ($VO_x$) film according to claim 1, wherein the deposited $VO_x$ film comprises nitrogen.

16. The method for manufacturing an amorphous vanadium oxide ($VO_x$) film according to claim 1, wherein the deposited $VO_x$ film comprises at least 0.2 atomic % nitrogen.

17. The method for manufacturing an amorphous vanadium oxide ($VO_x$) film according to claim 1, wherein the deposited $VO_x$ film comprises at least 0.5 atomic % nitrogen.

18. The method for manufacturing an amorphous vanadium oxide ($VO_x$) film according to claim 1, wherein the deposited $VO_x$ film comprises at least 0.7 atomic % nitrogen.

19. The method for manufacturing an amorphous vanadium oxide ($VO_x$) film according to claim 1, wherein the deposited $VO_x$ film comprises at least 1 atomic % nitrogen.

20. The method for manufacturing an amorphous vanadium oxide ($VO_x$) film according to claim 1, wherein the deposited $VO_x$ film comprises at least 3 atomic % nitrogen.

21. The method for manufacturing an amorphous vanadium oxide ($VO_x$) film according to claim 1, wherein the deposited $VO_x$ film comprises argon.

22. The method for manufacturing an amorphous vanadium oxide ($VO_x$) film according to claim 1, further comprising:
   supplying a second gas and a third gas to an ion source associated with the deposition chamber, wherein the second gas comprises an inert gas and the third gas comprises a reactive oxygen species; and
   activating the ion source; and
   wherein the step of vaporizing vanadium comprises vaporizing vanadium from the vanadium source using the ion source while the first gas and the nitrogen gas are flowing into the chamber and the second gas and the third gas are supplied to the ion source.

23. The method for manufacturing an amorphous vanadium oxide ($VO_x$) film according to claim 1, wherein at least one substrate dimension is 150 mm or greater and wherein the $VO_x$ film has a resistivity of at most 0.5 ohm-centimeters and a non-uniformity of resistivity of less than 3.0% over a region over a region having a diameter of at least a 130 mm.

24. A method for manufacturing a vanadium oxide ($VO_x$) film, comprising:
   loading a substrate into a deposition chamber;
   flowing a gas into the chamber, wherein the gas comprises molecules with at least nitrogen and oxygen in the same molecule; and
   vaporizing vanadium from a vanadium target while the gas is flowing into the chamber so as to deposit a $VO_x$ film on the substrate, where x>0.

25. A method of manufacturing a vanadium oxide ($VO_x$) film, comprising:
   loading a substrate into a deposition chamber;
   flowing a first gas into the chamber, the first gas containing a reactive oxygen species; and
   vaporizing vanadium and nitrogen from a vanadium nitride target while the first gas is flowing into the chamber so as to deposit a $VO_x$ film on the substrate, where x>0.

26. The method of manufacturing a vanadium oxide ($VO_x$) film according to claim 25, wherein the deposited $VO_x$ film comprises nitrogen.

27. The method of manufacturing a vanadium oxide ($VO_x$) film according to claim 25, further comprising flowing nitrogen gas into the chamber during the step of vaporizing the target.

28. A method for depositing an amorphous vanadium oxide ($VO_x$) film, comprising:
   loading a substrate into a deposition chamber;
   flowing a first gas into the chamber at a first regulated flow rate, the first gas containing a reactive oxygen species;
   flowing a process modifying additive gas into the chamber at a second regulated flow rate, wherein the first flow rate is greater than the second flow rate; and vaporizing vanadium from a vanadium source while the first gas and the process modifying additive gas are flowing into the chamber so as to deposit an amorphous $VO_x$ film on the substrate, where x>0.

29. The method for depositing according to claim 28, wherein the deposited $VO_x$ film comprises at least 0.5 atomic % nitrogen.

30. The method for depositing according to claim 28, wherein the $VO_x$ film comprises at least 0.7 atomic % nitrogen.

31. The method for depositing according to claim 28, wherein the $VO_x$ film comprises at least 1 atomic % nitrogen.

32. The method for depositing according to claim 28, wherein the $VO_x$ film comprises at least 3 atomic % nitrogen.

33. The method for depositing according to claim 29, wherein the deposition rate of $VO_x$ film is at least 20 Å per minute.

34. The method for depositing according to claim 33, wherein the deposition rate of $VO_x$ film is at least 50 Å per minute.

35. A method of manufacturing an amorphous vanadium oxide ($VO_x$) film, comprising:
    loading a substrate into a deposition chamber;
    flowing a first gas into the chamber, the first gas containing a reactive oxygen species;
    flowing nitrogen gas into the chamber; and
    vaporizing vanadium from a vanadium source while the first gas and the nitrogen gas are flowing into the chamber so as to deposit an amorphous $VO_x$ film on the substrate, where x>0.

36. The method of manufacturing according to claim 35, wherein the deposition rate of $VO_x$ film is at least 20 Å per minute.

37. The method of manufacturing according to claim 36, wherein the deposited $VO_x$ film comprises at least 0.5 atomic % nitrogen.

38. The method of manufacturing according to claim 36, wherein the $VO_x$ film comprises at least 0.7 atomic % nitrogen.

39. The method of manufacturing according to claim 36, wherein the $VO_x$ film comprises at least 1 atomic % nitrogen.

40. The method of manufacturing according to claim 36, wherein the $VO_x$ film comprises at least 3 atomic % nitrogen.

41. The method of manufacturing according to claim 37, wherein the substrate is not heated during the deposition of $VO_x$.

42. The method of manufacturing according to claim 35, wherein the step of flowing a first gas into the chamber comprises flowing the first gas at a first regulated flow rate, and the step of flowing process controlling gas into the chamber comprises flowing the process controlling gas at a second regulated flow rate, wherein the first flow rate is greater than the second flow rate.

43. A method of manufacturing an amorphous vanadium oxide ($VO_x$) film, comprising:
    loading a substrate into a deposition chamber;
    flowing a first gas into the chamber, the first gas containing a reactive oxygen species;
    flowing nitrogen gas into the chamber; and
    vaporizing vanadium from a vanadium source while the first gas and the nitrogen gas are flowing into the chamber so as to deposit an amorphous $VO_x$ film on the substrate, where x>0, wherein the nitrogen gas stabilizes the deposition rate of $VO_x$.

44. The method of manufacturing according to claim 43, wherein the deposition rate of $VO_x$ film is at least 20 Å per minute.

45. The method of manufacturing according to claim 43, wherein the deposited $VO_x$ film comprises at least 0.5 atomic % nitrogen.

46. The method of manufacturing according to claim 43, wherein the $VO_x$ film comprises at least 0.7 atomic % nitrogen.

47. The method of manufacturing according to claim 43, wherein the $VO_x$ film comprises at least 1 atomic % nitrogen.

48. The method of manufacturing according to claim 43, wherein the $VO_x$ film comprises at least 3 atomic % nitrogen.

49. The method of manufacturing according to claim 46, wherein the substrate is not heated during the deposition of $VO_x$.

50. A method for manufacturing an amorphous vanadium oxide ($VO_x$) film, comprising:
    loading a substrate into a deposition chamber;
    flowing a first gas into the chamber, the first gas containing a reactive oxygen species; and
    vaporizing vanadium from a vanadium source while the first gas is flowing into the chamber so as to deposit an amorphous $VO_x$ film on the substrate, where x>0 and wherein the $VO_x$ film has a resistivity of at most 0.3 ohm-centimeters and a non-uniformity of resistivity of less than 1.0% over a region having a diameter of at least a 130 mm.

51. The method for manufacturing according to claim 50, further comprising flowing nitrogen gas into the chamber during the step of vaporizing the vanadium source.

52. The method for manufacturing according to claim 51, wherein the step of flowing a first gas into the chamber comprising flowing the first gas at a first regulated flow rate and the step of flowing nitrogen gas in to the chamber comprises flowing the nitrogen gas a second regulated flow rate, the first flow rate being greater than the second flow rate.

53. The method for manufacturing according to claim 50, wherein the $VO_x$ film has a resistivity is less than 0.2 ohm-centimeters over a region having a diameter of at least a 130 mm.

54. The method for manufacturing according to claim 50, wherein the deposited $VO_x$ film comprises at least 1.0 atomic % nitrogen.

55. The method for manufacturing according to claim 50, wherein the substrate is not heated during the deposition of the $VO_x$ film.

56. The method for manufacturing according to claim 50, wherein the deposition rate of $VO_x$ film is at least 20 Å per minute.

57. The method for manufacturing according to claim 50, wherein the $VO_x$ film has a non-uniformity of resistivity of less than 1.0% over a region having a diameter of at least a 180 mm.

58. The method for manufacturing according to claim 50, wherein the $VO_x$ film has a resistivity of less than 0.2 ohm-centimeters over a region having a diameter of at least a 180 mm.

59. A method for manufacturing an amorphous vanadium oxide ($VO_x$) film, comprising:
    loading a substrate into a deposition chamber;
    flowing a first gas into the deposition chamber, the first gas comprising a reactive oxygen species;
    supplying a second gas and a third gas to an ion source associated with the deposition chamber, wherein the second gas comprises an inert gas and the third gas comprises a reactive oxygen species;
    activating the ion source; and
    vaporizing vanadium from an vanadium source using the ion source while the first gas is flowing into the chamber and the second gas and the third gas are supplied to the ion source so as to deposit a $VO_x$ film on the substrate, where x>0 and wherein the $VO_x$ film has a resistivity of at most 0.3 ohm-centimeters and a non-uniformity of resistivity of less than 3.0% over a region having a diameter of at least a 130 mm.

60. The method for manufacturing according to claim 59, further comprising flowing nitrogen gas into the chamber during the step of vaporizing the vanadium source.

61. The method for manufacturing according to claim 60, wherein:
   the step of flowing a first gas into the chamber comprises flowing the first gas at a first regulated flow rate; and
   the step of flowing nitrogen gas in to the chamber comprises flowing the nitrogen gas at a second regulated flow rate, the first flow rate combined with the flow rate of the third gas comprising a reactive oxygen species flowing through the ion source being greater than the second flow rate.

62. The method for manufacturing according to claim 59, wherein the $VO_x$ film has a non-uniformity of resistivity between 0.50% and 2.00% a region having a diameter of at least a 130 mm.

63. The method for manufacturing according to claim 59, wherein the deposited $VO_x$ film comprises at least 0.5 atomic % nitrogen.

64. The method for manufacturing according to claim 59, wherein the deposition rate of $VO_x$ film is at least 20 Å per minute.

65. The method for manufacturing according to claim 59, wherein the $VO_x$ film has a non-uniformity of resistivity of less than 3.0% over a region having a diameter of at least a 180 mm.

66. The method for manufacturing according to claim 59, wherein the $VO_x$ film has a non-uniformity of resistivity of between 0.5% and 2.0% over a region having a diameter of at least a 180 mm.

* * * * *